United States Patent
Ko et al.

(10) Patent No.: US 12,512,443 B2
(45) Date of Patent: Dec. 30, 2025

(54) DISPLAY DEVICE MANUFACTURING SUBSTRATE, AND METHOD FOR MANUFACTURING DISPLAY DEVICE BY USING SAME

(71) Applicant: LG ELECTRONICS INC., Seoul (KR)

(72) Inventors: Jisoo Ko, Seoul (KR); Kiseong Jeon, Seoul (KR); Gunho Kim, Seoul (KR); Hyeyoung Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 492 days.

(21) Appl. No.: 17/928,240

(22) PCT Filed: Jun. 1, 2020

(86) PCT No.: PCT/KR2020/007071
§ 371 (c)(1),
(2) Date: Nov. 28, 2022

(87) PCT Pub. No.: WO2021/246536
PCT Pub. Date: Dec. 9, 2021

(65) Prior Publication Data
US 2023/0223383 A1    Jul. 13, 2023

(51) Int. Cl.
*H01L 25/075* (2006.01)
*H01L 33/00* (2010.01)
*H10H 20/01* (2025.01)

(52) U.S. Cl.
CPC ....... *H01L 25/0753* (2013.01); *H10H 20/018* (2025.01)

(58) Field of Classification Search
CPC .. H01L 25/0753; H10H 20/018; H10H 20/01; H10H 20/857
See application file for complete search history.

(56) References Cited

U.S. PATENT DOCUMENTS

2018/0286734 A1* 10/2018 Meitl ................. H01L 21/6835
2020/0105735 A1    4/2020 Park et al.
(Continued)

FOREIGN PATENT DOCUMENTS

CN        109755232 A     5/2019
JP        2013-197390 A   9/2013
(Continued)

OTHER PUBLICATIONS

Jeon, KR10-2018-0089771, machine translation, Sep. 2018 (Year: 2018).*
(Continued)

*Primary Examiner* — Tracie Y Green
(74) *Attorney, Agent, or Firm* — Birch, Stewart, Kolasch & Birch, LLP

(57) ABSTRACT

A display device manufacturing substrate according to the present disclosure comprises: a base part; assembly electrodes which extend in one direction and which are arranged on the base part; a dielectric layer formed on the base part to cover the assembly electrodes; a partitioning part formed on the dielectric layer; and cells which are formed in a plurality of rows and columns by means of the partitioning part, and on which semiconductor light-emitting elements are loaded, wherein the assembly electrodes extend in either the row direction or the column direction to overlap cells in the extending direction, and the assembly electrodes comprise a first assembly electrode overlapping cells that form one row or column, and a second assembly electrode simultaneously overlapping cells that form different rows or columns which are adjacent.

11 Claims, 18 Drawing Sheets

(56) References Cited

U.S. PATENT DOCUMENTS

| | | |
|---|---|---|
| 2020/0235077 A1 | 7/2020 | Jeon et al. |
| 2021/0005642 A1* | 1/2021 | Chen .................... H10D 86/451 |
| 2021/0273131 A1 | 9/2021 | Kang et al. |
| 2022/0005978 A1* | 1/2022 | Im ........................ H10H 20/857 |
| 2022/0028923 A1 | 1/2022 | Li et al. |
| 2022/0328335 A1 | 10/2022 | Shim et al. |
| 2022/0352445 A1 | 11/2022 | Kim et al. |
| 2022/0416128 A1* | 12/2022 | Kang .................... H10H 20/01 |
| 2023/0045160 A1* | 2/2023 | Kim ................. H01L 21/67144 |
| 2023/0049446 A1* | 2/2023 | Kim ..................... H10H 20/857 |
| 2023/0352643 A1 | 11/2023 | Cho et al. |

FOREIGN PATENT DOCUMENTS

| | | |
|---|---|---|
| JP | 2020-42955 A | 3/2020 |
| KR | 10-2018-0089771 A | 8/2018 |
| KR | 10-2020-0013824 A | 2/2020 |
| KR | 10-2020-0021574 A | 3/2020 |
| KR | 10-2020-0023316 A | 3/2020 |
| KR | 10-2020-0024177 A | 3/2020 |
| KR | 10-2020-0026682 A | 3/2020 |
| KR | 10-2020-0026683 A | 3/2020 |
| KR | 10-2020-0026768 A | 3/2020 |
| WO | WO 2020/059987 A1 | 3/2020 |
| WO | WO 2020/060006 A1 | 3/2020 |
| WO | WO 2020/105824 A1 | 5/2020 |

OTHER PUBLICATIONS

Jang, KR10-2020-0024177, machine translation, Feb. 2020 (Year: 2020).*

\* cited by examiner (a)

(b)

(a)

(b)

DISPLAY DEVICE MANUFACTURING SUBSTRATE, AND METHOD FOR MANUFACTURING DISPLAY DEVICE BY USING SAME

CROSS REFERENCE TO RELATED APPLICATION

This application is the National Phase of PCT International Application No. PCT/KR2020/007071, filed on Jun. 1, 2020, which is hereby expressly incorporated by reference into the present application.

TECHNICAL FIELD

The present disclosure relates to a display device manufacturing substrate used when a display device is manufactured, by using a semiconductor light emitting device, particularly, a semiconductor light emitting device having a size of several to several tens of micrometers, and a method for manufacturing a display device using the same.

BACKGROUND ART

Recently, in order to implement a large-area display in the fields of display technologies, liquid crystal displays (LCD), organic light emitting diode displays (OLEDs), and micro LED displays are in competition.

Among them, a display using a semiconductor light emitting device (micro LED) having a diameter or cross-sectional area of 100 μm or less may provide very high efficiency because the display does not absorb light using a polarizing plate or the like.

However, since the micro LED display requires millions of semiconductor light emitting devices to implement a large area, it is difficult to transfer the devices compared to other technologies.

The technologies being currently developed for the transfer process of the micro LED include pick & place, laser lift-off (LLO), or self-assembly. Among them, a self-assembly method is a method in which a semiconductor light emitting device finds its own position within a fluid and is the most advantageous method for realizing a large-screen display device.

The self-assembly method includes a method of directly transferring the semiconductor light emitting devices to a substrate to be used as a product and a method of transferring the semiconductor light emitting devices to a substrate for assembly and then transferring the semiconductor light emitting devices to a substrate to be used as a product. The former is efficient in terms of the process because the transfer process is performed once, and the latter has an advantage of being able to add a structure for self-assembly to an assembly substrate without limitation, and thus, the two methods are selectively used.

DETAILED DESCRIPTIONS OF THE INVENTION

Technical Problem

An object of the present disclosure is to realize a high-resolution large-area display device. In addition, another object of the present disclosure is to simplify a process of manufacturing a display device.

Technical Solution

According to the present disclosure, a substrate for manufacturing a display device include: a base part; assembly electrodes extending in one direction and arranged on the base part; a dielectric layer disposed on the base part to cover the assembly electrodes; a partitioning part disposed on the dielectric layer; and cells provided in a plurality of rows and columns by the partitioning part and on which semiconductor light emitting devices are loaded, wherein the assembly electrodes extend in either the row direction or the column direction to overlap the cells in the extending direction, and the assembly electrodes include a first assembly electrode overlapping the cells arranged in one row or column, and a second assembly electrode simultaneously overlapping the cells arranged in different rows or columns adjacent to each other.

In the present disclosure, the second assembly electrode may be disposed between the first assembly electrodes.

In the present disclosure, the assembly electrodes may include: a body extending in the row direction or column direction; and a protrusion protruding toward the cell to overlap the cell on the body, wherein the first assembly electrode may include the protrusion at one side of the body, and the second assembly electrode may include the protrusion at each of both sides of the body.

In the present disclosure, the cells arranged in the same row among the cells may have a first interval, and the cells arranged in the same column may have a second interval.

In the present disclosure, the assembly electrodes may extend in a direction crossing a direction of a narrower interval of the first interval and the second interval.

In the present disclosure, at least two types of semiconductor light devices emitting among a first semiconductor light emitting device that emits light having a first color, a second semiconductor light emitting device that emits light having a second color, and a third semiconductor light emitting device that emits light having a third color may be seated in the cells, and the same type of semiconductor light emitting devices may be seated in the cells arranged in the same row or column.

In the present disclosure, different types of semiconductor light emitting devices may have different shapes, and each of the cells in which the different types of semiconductor light emitting devices are seated may have a shape corresponding to each of the semiconductor light emitting devices.

In the present disclosure, the second assembly electrode may overlap the cells in which different types of semiconductor light emitting devices are mounted.

According to the present disclosure, a method for manufacturing a display device includes: (a) putting semiconductor light emitting devices into a fluid chamber and transferring a substrate including assembled electrodes and cells arranged in a plurality of rows and columns to a preset assembly position; (b) applying magnetic force to the semiconductor light emitting devices from one side of the substrate to move the semiconductor light emitting devices in one direction; and (c) applying a voltage to the assembly electrodes to seat the moving semiconductor light emitting devices in the cell, wherein the assembled electrodes extend in any one of the row direction and the column direction to overlap the cells in the extending direction, and the assembly electrodes include: a first assembly electrode overlapping the cells arranged in one row or column; and a second assembly electrode overlapping the cells arranged in adjacent rows or columns.

In the present disclosure, the second assembly electrode may be disposed between the first assembly electrodes.

In the present disclosure, at least two types of semiconductor light emitting devices among a first semiconductor light emitting device that emits light having a first color, a second semiconductor light emitting device that emits light having a second color, and a third semiconductor light emitting device that emits light having a third color may be seated in the cells, the first semiconductor light emitting device, the second semiconductor light emitting device, and the third semiconductor light emitting device having different shapes each other, and each of the cells may be provided in a shape corresponding to each of different types of semiconductor light emitting devices, wherein the (a) to (c) may be performed collectively for different types of semiconductor light emitting devices.

In the present disclosure, the method may further include a process of transferring the semiconductor light emitting seated on the substrate to a wiring substrate.

In the present disclosure, the method may further include a process of forming a wiring electrode for lighting the semiconductor light emitting devices seated on the substrate.

Effects of the Invention

The present disclosure may reduce the number of assembly electrodes to which the voltage is applied during the self-assembly so that the cells on which the semiconductor light emitting devices are seated are disposed at the denser intervals, and furthermore, the high-resolution display device may be realized. In addition, the present disclosure may reduce the manufacturing cost while simplifying the process of manufacturing the display device.

MODE FOR CARRYING OUT THE INVENTION

Hereinafter, embodiments disclosed in this specification is described with reference to the accompanying drawings, and the same or corresponding components are given with the same drawing number regardless of reference number, and their duplicated description will be omitted. The suffixes "module" and "unit" for components used in the description below are assigned or mixed in consideration of easiness in writing the specification and do not have distinctive meanings or roles by themselves. Moreover, In description of embodiments disclosed in this specification, detailed descriptions related to well-known functions or configurations will be ruled out in order not to unnecessarily obscure subject matters of the present disclosure. In addition, the accompanying drawings are only for easy understanding of the embodiments disclosed in the present specification, and should not be construed as limiting the technical spirit disclosed in the present specification by the accompanying drawings.

In the following description, it will be understood that when an element such as a layer, a region, or substrate is referred to as being 'on' another layer, region, or substrate, it can be directly on the other layer, region, or substrate, or intervening layers, regions, or substrates may also be present.

A display device described in this specification includes a mobile phone, a smart phone, a laptop computer, a digital broadcasting terminal, a personal digital assistant (PDA), a portable multimedia player (PMP), a navigation system, a slate PC, a tablet PC, an ultrabook, a digital TV, a desktop computer, and the like. However, the configuration according to an embodiment described in this specification may be applied as long as the configuration includes a display even in a new product form to be developed later.

Figure 1:
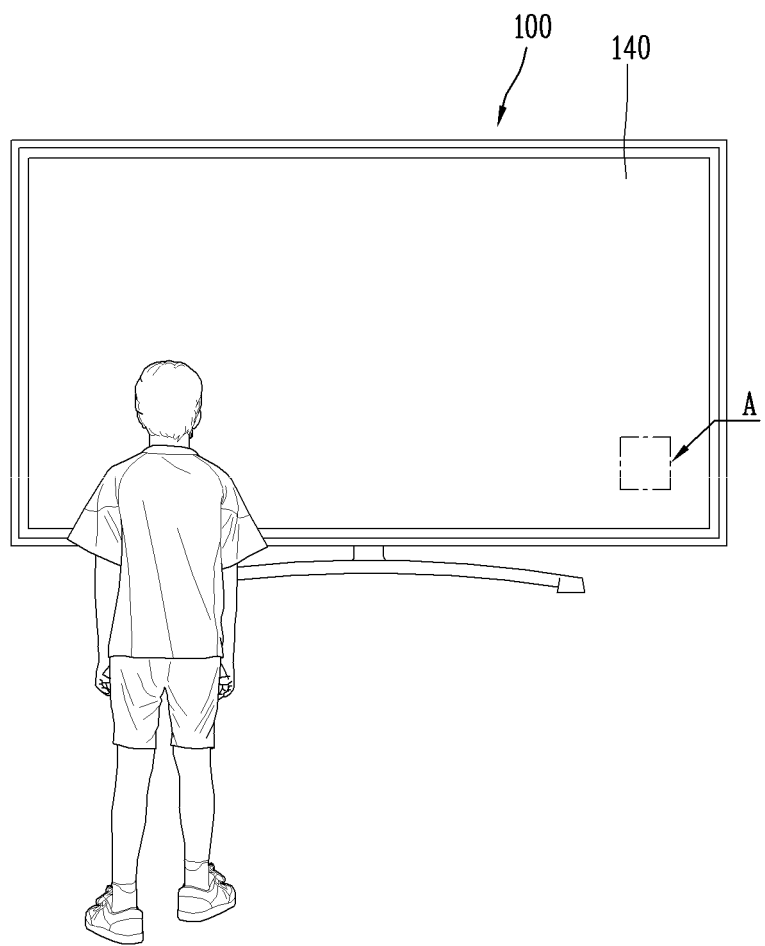
FIG. 1 is a conceptual view of a display device using a semiconductor light emitting device according to an embodiment of the present disclosure.
Figure 2:
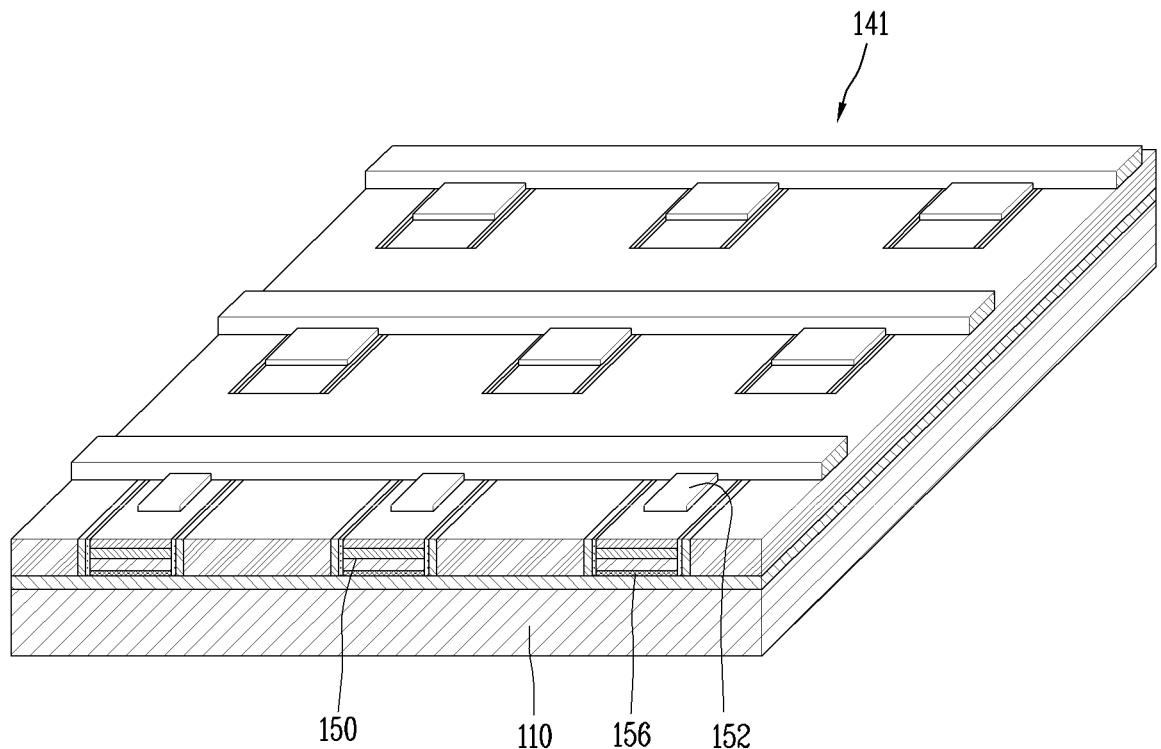
FIG. 2 is a partial enlarged view illustrating a portion A of the display device of FIG. 1.
Figure 3:
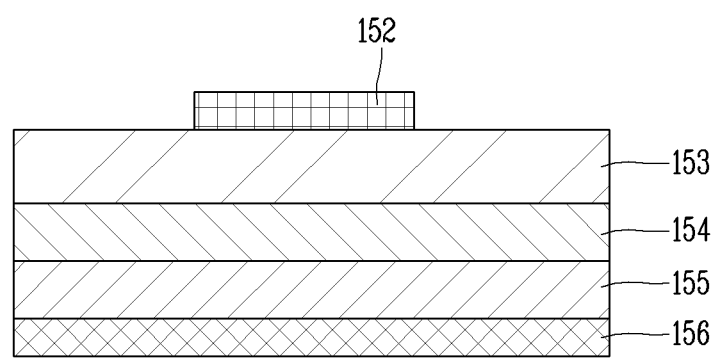
FIG. 3 is an enlarged view of the semiconductor light emitting device of FIG. 2.
Figure 4:
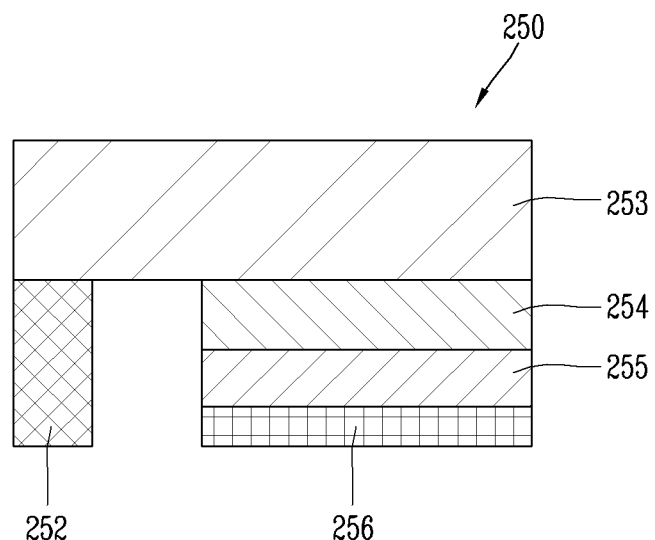
FIG. 4 is an enlarged view of the semiconductor light emitting device of FIG. 2 according to another embodiment.

FIG. 1 is a conceptual view of a display device using a semiconductor light emitting device according to an embodiment of the present disclosure, FIG. 2 is a partial enlarged view illustrating a portion A of the display device of FIG. 1, FIG. 3 is an enlarged view of the semiconductor light emitting device of FIG. 2, and FIG. 4 is an enlarged view of the semiconductor light emitting device of FIG. 2 according to another embodiment.

As illustrated in the drawings, information processed by a controller of a display device 100 may be output from a display module 140. A closed-loop case 101 surrounding an edge of the display module 140 may define a bezel of the display device 100.

The display module 140 may include a panel 141, on which an image is displayed, and the panel 141 may include a micro-sized semiconductor light emitting device 150 and a wiring substrate 110 on which the semiconductor light emitting device 150 is mounted.

A wiring may be disposed on the wiring substrate 110 and be connected to an n-type electrode 152 and a p-type electrode 156 of the semiconductor light emitting device 150. Thus, the semiconductor light emitting device 150 may be provided on the wiring substrate 110 as an individual pixel that emits light by itself.

The image displayed on the panel 141 is visual information and is realized by independently controlling light emission of sub-pixels arranged in a matrix form through the wiring.

In the present disclosure, a micro LED (light emitting diode) is exemplified as a type of the semiconductor light emitting device 150 that converts current into light. The micro LED may be a light emitting diode provided in a small size of 100 μm or less. In the semiconductor light emitting device 150, blue, red, and green colors may be respectively provided in light emitting regions, and a unit pixel may be realized by a combination thereof. That is, the unit pixel means a minimum unit for realizing one color, and at least three micro LEDs may be provided in the unit pixel.

More specifically, referring to FIG. 3, the semiconductor light emitting device 150 may have a vertical structure.

For example, the semiconductor light emitting device 150 may be mainly made of gallium nitride (GaN) and be added with indium (In) and/or aluminum (Al) so as to be implemented as a high-power light emitting device that emits various light in addition to blue light.

The vertical semiconductor light emitting device 150 includes a p-type electrode 156, a p-type semiconductor layer 155 disposed on the p-type electrode 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 that is disposed at a lower side may be electrically connected to a p-electrode of the wiring substrate 110, and the n-type electrode 152 that is disposed at an upper side may be electrically connected to an n-electrode above the semiconductor light emitting device 150. The vertical semiconductor light emitting device 150 has a great advantage in that a size of a chip is reduced because the electrodes are arranged vertically.

As another example, referring to FIG. 4, the semiconductor light emitting device may be a flip chip type light emitting device.

As an example, the semiconductor light emitting device 250 includes a p-type electrode 256, a p-type semiconductor layer 255 in which the p-type electrode 256 is provided, an active layer 254 disposed on the p-type semiconductor layer 255, an n-type semiconductor layer 253 disposed on the active layer 254, and an n-type electrode 252 disposed to be spaced horizontally from the p-type electrode 256 on the n-type semiconductor layer 253. In this case, both the p-type electrode 256 and the n-type electrode 252 may be electrically connected to the p-electrode and the n-electrode of the wiring substrate 110 under the semiconductor light emitting device 250, respectively.

Each of the vertical semiconductor light emitting device 150 and the horizontal semiconductor light emitting device 250 may include a green semiconductor light emitting device, a blue semiconductor light emitting device, and a red semiconductor light emitting device. In the case of the green semiconductor light emitting device and the blue semiconductor light emitting device, gallium nitride (GaN) may be mainly used, and indium (In) and/or aluminum (Al) may be added together to be implemented as a high-power light emitting device that emits green or blue light. For this example, the semiconductor light emitting device may be a gallium nitride thin film constituted by various layers such as n-Gan, p-Gan, AlGaN, InGaN, and the like, and specifically, the p-type semiconductor layer may be p-type GaN, and the n-type semiconductor layer may be n-type GaN. However, in the case of the red semiconductor light emitting device, the p-type semiconductor layer may be p-type GaAs, and the n-type semiconductor layer may be n-type GaAs.

In addition, a p-electrode side of the p-type semiconductor layer may be a p-type GaN doped with Mg, and an n-electrode side of the n-type semiconductor layer may be an n-type GaN doped with Si. In this case, the above-described semiconductor light emitting devices may be semiconductor light emitting devices without the active layer.

Referring to FIGS. 1 to 4, since the light emitting diode is very small, the unit pixels that allow the display panel to emit light by itself may be fixedly arranged to realize a high-definition display device.

In the display device using the above-described semiconductor light emitting device of the present disclosure, a semiconductor light emitting device grown on a wafer and formed through mesa and isolation is used as an individual pixel.

In this case, the micro-sized semiconductor light emitting device 150 has to be transferred to a preset position on the substrate of the display panel on the wafer. There is a pick & place method as such a transfer technology, but a success rate is low, and it takes a lot of time. As another example, there is a technique of transferring several devices at a time using a stamp or a roll, but it is not suitable for a large screen display due to a limitation in yield.

The present disclosure proposes a new method and device for manufacturing the display device, which are capable of solving the limitation.

For this, first, a new method of manufacturing the display device will be described. FIGS. 5a to 5e are conceptual views for explaining a new process of manufacturing the above-described semiconductor light emitting device.

In the present specification, a display device using a passive matrix (PM) type semiconductor light emitting device is exemplified. However, the examples described below are also applicable to an active matrix (AM) type semiconductor light emitting device. In addition, a method of self-assembling the horizontal semiconductor light emitting device is exemplified below, but this is also applicable to a method of self-assembling the vertical semiconductor light emitting device.

Figure 5A:
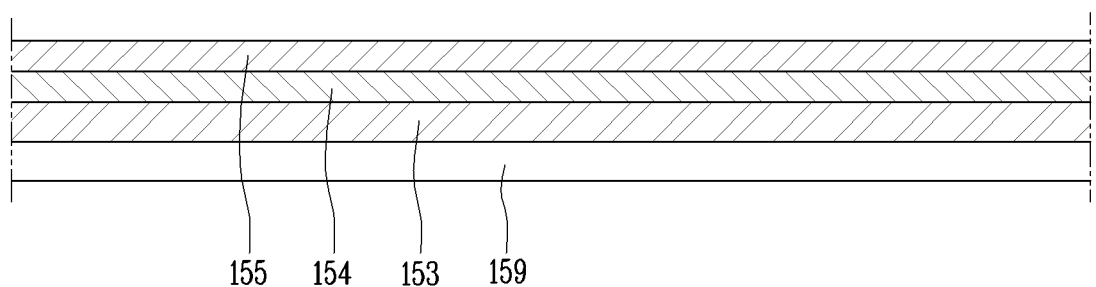
FIGS. 5a to 5e are conceptual views for explaining a new process of manufacturing the above-described semiconductor light emitting device.

First, according to the manufacturing method, each of a first conductivity-type semiconductor layer 153, an active layer 154, and a second conductivity-type semiconductor layer 155 is grown on a growth substrate 159 (FIG. 5a).

After the first conductivity-type semiconductor layer 153 is grown, the active layer 154 is grown on the first conductivity-type semiconductor layer 153, and then the second conductivity-type semiconductor layer 155 is grown on the active layer 154. As described above, when the first conductivity-type semiconductor layer 153, the active layer 154, and the second conductivity-type semiconductor layer 155 are sequentially grown, the first conductivity-type semiconductor layer 153, the active layer 154, and the second conductivity-type semiconductor layer 155 form a stacked structure as illustrated in FIG. 5a.

In this case, the first conductivity-type semiconductor layer 153 may be a p-type semiconductor layer, and the second conductivity-type semiconductor layer 155 may be an n-type semiconductor layer. However, the present disclosure is not necessarily limited thereto, and examples in which the first conductivity-type is the n-type, and the second conductivity-type is the p-type are also possible.

In addition, although the present embodiment exemplifies a case in which the active layer 154 is present, a structure in which the active layer 154 is not present is also possible in some cases as described above. As an example, a p-electrode side of the p-type semiconductor layer may be a p-type GaN doped with Mg, and an n-electrode side of the n-type semiconductor layer may be an n-type GaN doped with Si.

The growth substrate 159 (wafer) may be made of a light-transmissive material, for example, any one of sapphire ($Al_2O_3$), GaN, ZnO, and AlO, but is not limited thereto. In addition, the growth substrate 159 may be made of a material that is suitable for semiconductor material growth (carrier wafer) or a material having excellent thermal conductivity. The growth substrate 159 may include a conductive substrate or an insulating substrate, for example, a SiC substrate having thermal conductivity greater than that of a sapphire ($Al_2O_3$) substrate or at least one of Si, GaAs, GaP, InP, and $Ga_2O_3$ may be used.

Figure 5B:
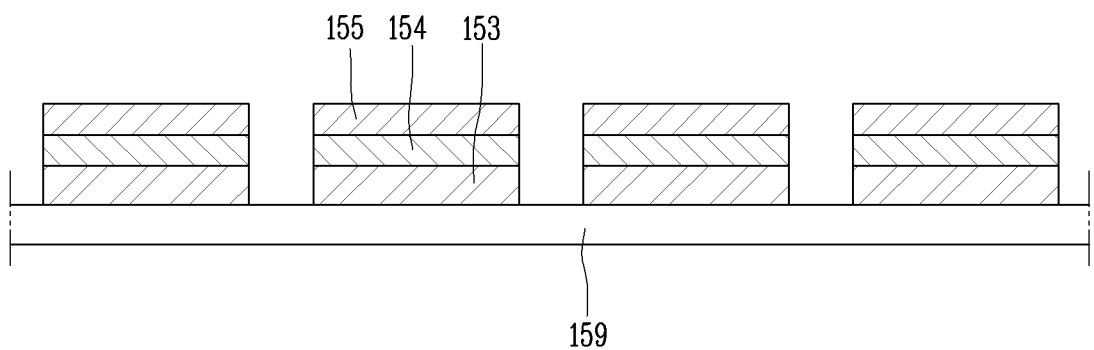

Next, at least a portion of the first conductivity-type semiconductor layer 153, the active layer 154, and the second conductivity-type semiconductor layer 155 are removed to form a plurality of semiconductor light emitting devices (FIG. 5b).

More specifically, isolation is performed so that the plurality of semiconductor light emitting devices form a light emitting device array. That is, the first conductivity-type semiconductor layer 153, the active layer 154, and the second conductivity-type semiconductor layer 155 are vertically etched to form the plurality of semiconductor light emitting devices.

If the horizontal type semiconductor light emitting device is formed, a mesa process, in which the active layer 154 and the second conductivity-type semiconductor layer 155 are partially removed in the vertical direction to expose the first conductivity-type semiconductor layer 153 to the outside, and an isolation process, in which the first conductivity-type semiconductor layer 153 is etched after the mesa process to form a plurality of semiconductor light emitting device arrays, may be performed.

Figure 5C:
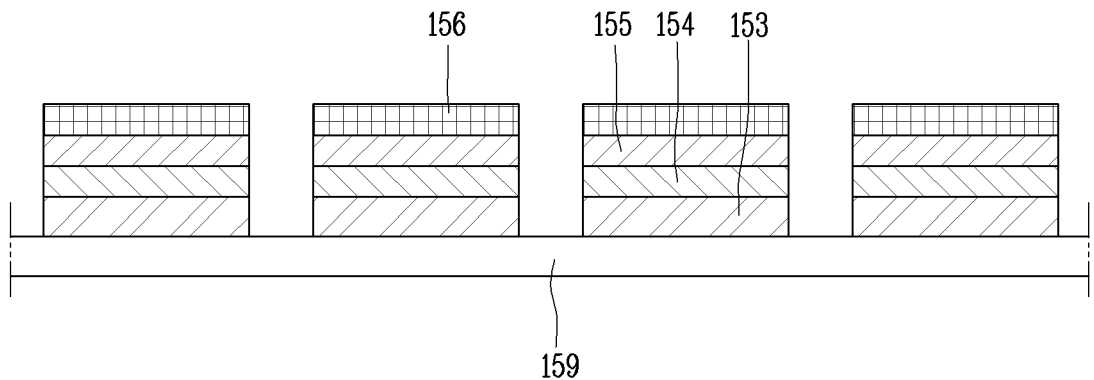

Next, the second conductivity-type electrode 156 (or p-type electrode) is formed on one surface of the second conductivity-type semiconductor layer 155 (FIG. 5c). The second conductivity-type electrode 156 may be formed by a deposition method such as sputtering, but is not limited thereto. However, when the first conductivity-type semiconductor layer and the second conductivity-type semiconductor layer are the n-type semiconductor layer and the p-type semiconductor layer, respectively, it is also possible that the second conductivity-type electrode 156 may be the n-type electrode.

Figure 5D:
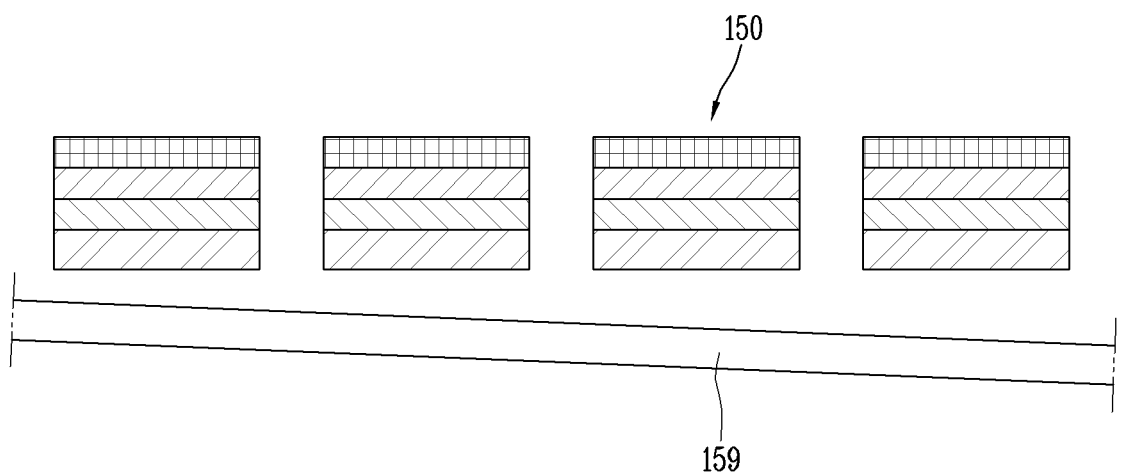

Then, the growth substrate 159 is removed to provide the plurality of semiconductor light emitting devices. For example, the growth substrate 159 may be removed using a laser lift-off method (LLO) or a chemical lift-off method (CLO) (FIG. 5d).

Figure 5E:
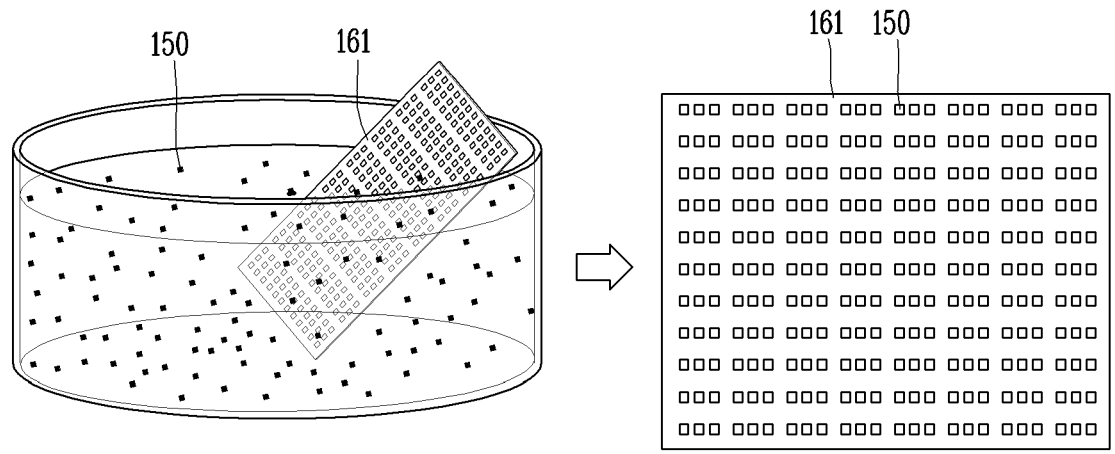

Thereafter, a process of seating the semiconductor light emitting devices 150 on the substrate in a chamber filled with a fluid is performed (FIG. 5e).

For example, the semiconductor light emitting devices 150 and the substrate are put into the chamber filled with the fluid, and the semiconductor light emitting devices 150 are self-assembled on the substrate using flow, gravity, surface tension, and the like. In this case, the substrate may be an assembly substrate 161.

As another example, the wiring substrate instead of the assembly substrate 161 may be put into the fluid chamber to seat the semiconductor light emitting devices 150 on the wiring substrate. However, for convenience of explanation, in the present disclosure, the case in which the substrate is provided as the assembly substrate 161 to seat semiconductor light emitting devices 150 is exemplified.

Cells (not shown) into which the semiconductor light emitting devices 150 are inserted may be provided on the assembly substrate 161 so that the semiconductor light emitting devices 150 are easily seated on the assembly substrate 161. Specifically, the cells in which the semiconductor light emitting devices 150 are seated are disposed on the assembly substrate 161 at positions at which the semiconductor light emitting devices 150 are aligned with wiring electrodes. The semiconductor light emitting devices 150 are assembled to the cells while moving in the fluid.

After the plurality of semiconductor light emitting devices 150 are seated on the assembly substrate 161, the semiconductor light emitting devices 150 of the assembly substrate 161 are transferred to the wiring substrate, thereby enabling large-area transfer. Thus, the assembly substrate 161 may be referred to as a temporary substrate.

In order to apply the self-assembly method described above to the manufacturing of the large-screen display, it is necessary to improve transfer yield. The present disclosure proposes a method and device for minimizing an influence of gravity or frictional force and preventing non-specific coupling so as to improve the transfer yield.

In this case, in the display device according to the present disclosure, a magnetic material is disposed on the semiconductor light emitting device so that the semiconductor light emitting device moves using magnetic force, and while the semiconductor light emitting device moves, the semiconductor light emitting device is seated at a preset position using an electric field. Hereinafter, such a transfer method and device will be described in more detail with reference to the accompanying drawings.

Figure 6:
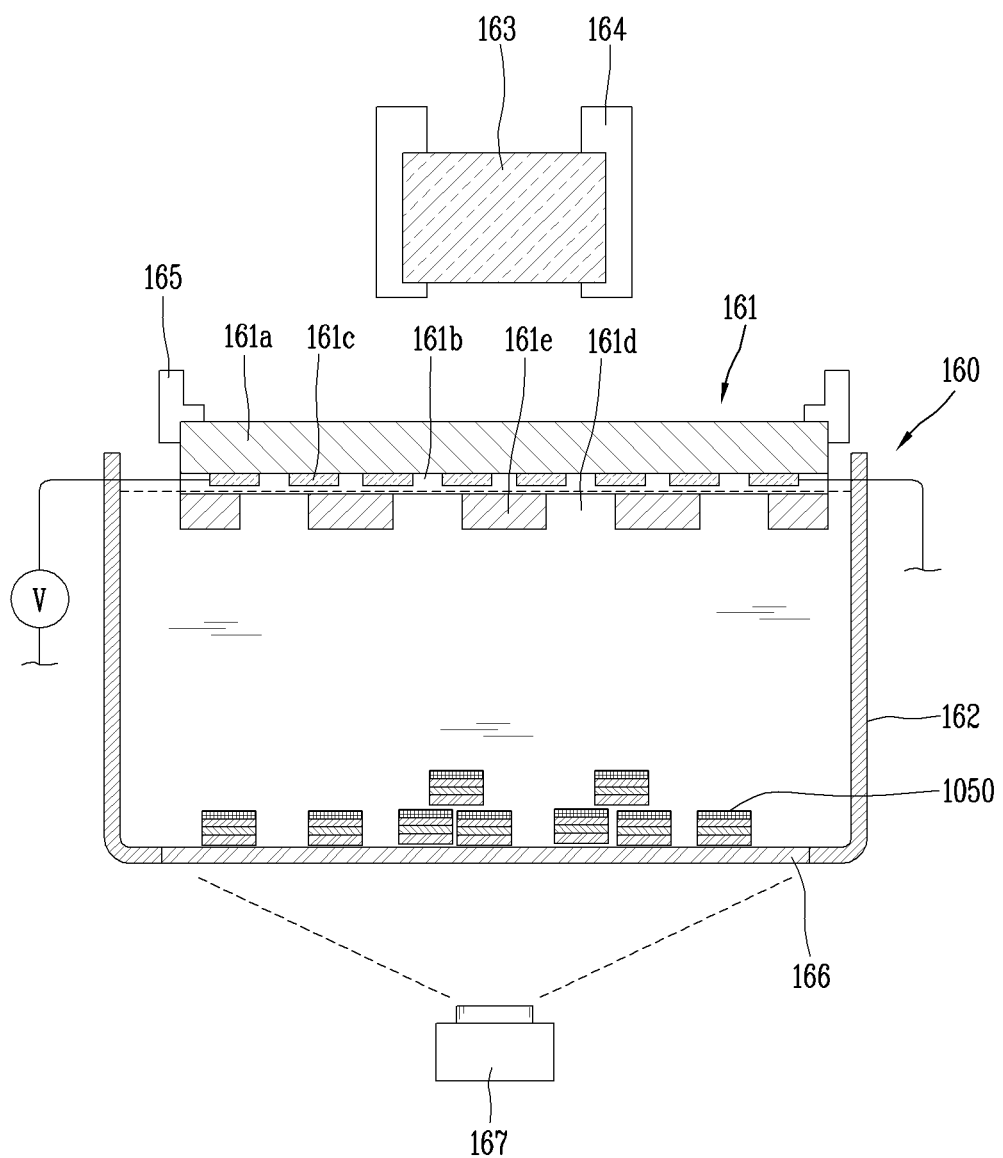
FIG. 6 is a conceptual view illustrating an example of a self-assembly device of the semiconductor light emitting device according to the present disclosure.
Figure 7:
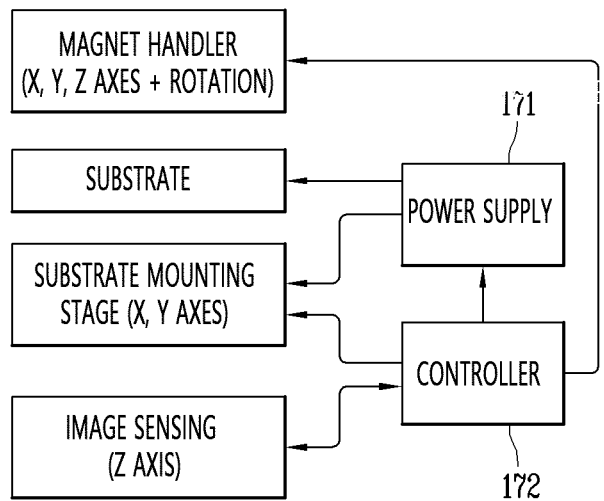
FIG. 7 is a block diagram of the self-assembly device of FIG. 6.

FIG. 6 is a conceptual view illustrating an example of the self-assembly device of the semiconductor light emitting device according to the present disclosure, and FIG. 7 is a block diagram of the self-assembly device of FIG. 6. In addition, FIGS. 8a to 8e are conceptual views illustrating a process of self-assembling the semiconductor light emitting device using the self-assembly device of FIG. 6, and FIG. 9 is a conceptual view for explaining the semiconductor light emitting device of FIGS. 8a to 8e.

Referring to FIGS. 6 and 7, the self-assembly device 160 of the present disclosure may include a fluid chamber 162, a magnet 163, and a positioning controller 164.

The fluid chamber 162 has a space in which the plurality of semiconductor light emitting devices are accommodated. The space may be filled with a fluid, and the fluid may include water or the like as an assembly solution. Thus, the fluid chamber 162 may be a water tank and may be configured as an open type. However, the present disclosure is not limited thereto, and the fluid chamber 162 may be a closed type in which the space is a closed space.

The fluid chamber 162 may be disposed so that an assembly surface of the substrate 161 on which the semiconductor light emitting devices 150 are assembled faces downward. For example, the substrate 161 may be transferred to an assembly position by a transfer part, and the transfer part may include a stage 165 on which the substrate is mounted. A position of the stage 165 may be controlled by a controller, and thus, the substrate 161 may be transferred to the assembly position.

Here, the assembly surface of the substrate 161 faces the bottom of the fluid chamber 162 at the assembly position. As illustrated in the drawings, the assembly surface of the substrate 161 is disposed to be immersed in the fluid in the fluid chamber 162. Thus, the semiconductor light emitting device 150 moves to the assembly surface in the fluid.

The substrate 161 is an assembled substrate capable of generating the electric field and may include a base part 161a, a dielectric layer 161b, and a plurality of electrodes 161c.

The base part 161a may be made of an insulating material, and each of the plurality of electrodes 161c may be a thin film or a thick bi-planar electrode patterned on one surface of the base part 161a. The electrode 161c may be made of, for example, a stack of Ti/Cu/Ti, Ag paste, ITO, or the like.

The dielectric layer 161b may be made of an inorganic material such as $SiO_2$, $SiN_x$, SiON, $Al_2O_3$, $TiO_2$, or $HfO_2$. Alternatively, the dielectric layer 161b may be provided as a single layer or a multi-layer as an organic insulator. A thickness of the dielectric layer 161b may be in the range of several tens of nm to several μm.

Furthermore, the substrate according to the present disclosure includes a plurality of cells 161d partitioned by a partitioning wall. The cells 161d are sequentially arranged in one direction and may be made of a polymer material. Also, the partitioning wall 161e partitioning the cells 161d are shared with the neighboring cells 161d. The partitioning wall 161e may protrude from the base part 161a, and the cells 161d may be sequentially disposed along one direction by the partitioning wall 161e. More specifically, the cells 161d may be sequentially arranged in column and row directions, respectively, and may have a matrix structure.

Each of the cells 161d may have a groove for accommodating each of the semiconductor light emitting devices 150, and the groove may be a space defined by the partitioning wall 161e. A shape of the groove may be the same as or similar to that of the semiconductor light emitting device. For example, when the semiconductor light emitting device has a rectangular shape, the groove may have a rectangular shape. Also, when the semiconductor light emitting device has a circular shape, the groove defined in each of the cells may have a circular shape. Furthermore, each of the cells 161d is configured to accommodate a single semiconductor light emitting device. That is, one semiconductor light emitting device is accommodated in one cell.

The plurality of electrodes 161c may include a plurality of electrode lines disposed at the bottom of each of the cells 161d, and the plurality of electrode lines may extend to adjacent cells.

The plurality of electrodes 161c are disposed under the cells 161d, and different polarities different from each other are applied to generate an electric field in the cells 161d. To generate the electric field, the dielectric layer 161b may cover the plurality of electrodes 161c, and the dielectric layer 161b may form the bottom of each of the cells 161d. In this structure, when the different polarities are applied to the pair of electrodes 161c under each of the cells 161d, the electric field may be generated, and the semiconductor light emitting device may be inserted into the cells 161d by the electric field.

The electrodes of the substrate 161 are electrically connected to a power supply 171 at the assembly position. The power supply 171 applies power to the plurality of electrodes 161c to generate the electric field.

As illustrated in the drawings, the self-assembly device may include a magnet 163 that applies magnetic force to the semiconductor light emitting devices 150. The magnet 163 is spaced apart from the fluid chamber 162 to apply the magnetic force to the semiconductor light emitting devices 150. The magnet 163 may be disposed to face an opposite surface of the assembly surface of the substrate 161, and the position of the magnet 163 is controlled by the positioning controller 164 connected to the magnet 163.

The semiconductor light emitting device may include a magnetic material to move in the fluid by the magnetic field of the magnet 163.

Referring to FIG. 9, a semiconductor light emitting device 1050 including the magnetic material may include a first conductivity-type electrode 1052 and a second conductivity-type electrode 1056, a first conductivity-type semiconductor layer 1053 on which the first conductive electrode 1052 is disposed, a second conductivity-type semiconductor layer 1055 which overlaps the first conductivity-type semiconductor layer 1053 and on which the second conductivity-type electrode 1056 is disposed, and an active layer 1054 disposed between the first and second conductivity-type semiconductor layers 1053 and 1055.

Here, the first conductivity-type may be a p-type, the second conductivity-type may be an n-type, and vice versa. In addition, as described above, the semiconductor light emitting device without the active layer may be used.

In the present disclosure, the first conductive electrode 1052 may be generated after the semiconductor light emitting device 1050 is assembled on a wiring substrate by self-assembly or the like. Also, in the present disclosure, the second conductivity-type electrode 1056 may include a magnetic material. The magnetic material may mean a magnetic metal. The magnetic material may be Ni, SmCo, or the like, and as another example, may include a material corresponding to at least one of a Gd-based, La-based, or Mn-based material.

The magnetic material may be provided in the second conductivity-type electrode 1056 in the form of particles. Alternatively, in the conductive electrode including the magnetic material, one layer of the conductive electrode may be made of the magnetic material. For this example, as illustrated in FIG. 9, the second conductivity-type electrode 1056 of the semiconductor light emitting device 1050 may include a first layer 1056a and a second layer 1056b. Here, the first layer 1056a may include a magnetic material, and the second layer 1056b may include a metal material rather than the magnetic material.

In this example, the first layer 1056a including the magnetic material may be disposed to be in contact with the second conductivity-type semiconductor layer 1055. In this case, the first layer 1056a may be disposed between the second layer 1056b and the second conductivity-type semiconductor layer 1055, and the second layer 1056b may be made of a contact metal connected to a wiring of the wiring substrate. However, the present disclosure is not necessarily limited thereto, and the magnetic material may be disposed on one surface of the first conductivity-type semiconductor layer 1053.

Referring again to FIGS. 6 and 7, the self-assembly device may include a magnet handler that is capable of moving automatically or manually in x, y, and z axes at an upper portion of the fluid chamber 162 or a motor that is capable of allowing the magnet 163 to rotate. Each of the magnet handler and the motor may constitute the positioning controller 164. As a result, the magnet 163 rotates in a direction parallel to the substrate 161, a clockwise direction, or a counterclockwise direction.

A light-transmitting bottom plate 166 may be provided in the fluid chamber 162, and the semiconductor light emitting devices may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by the controller 172 and may include an inverted type lens and a CCD to observe the assembly surface of the substrate 161.

The self-assembly device described above is configured to use a combination of a magnetic field and an electric field, and when using this structure, each of the semiconductor light emitting devices may be seated at a preset position on the substrate by the electric field in the process of moving by a change in the position of the magnet. Hereinafter, the assembly process using the self-assembly device described above will be described in more detail.

First, the plurality of semiconductor light emitting devices 1050 including the magnetic material are formed through the process described with reference to FIGS. 5a to 5c. In this case, the magnetic material may be deposited in the process of forming the second conductivity-type electrode of FIG. 5c.

Figure 8A:
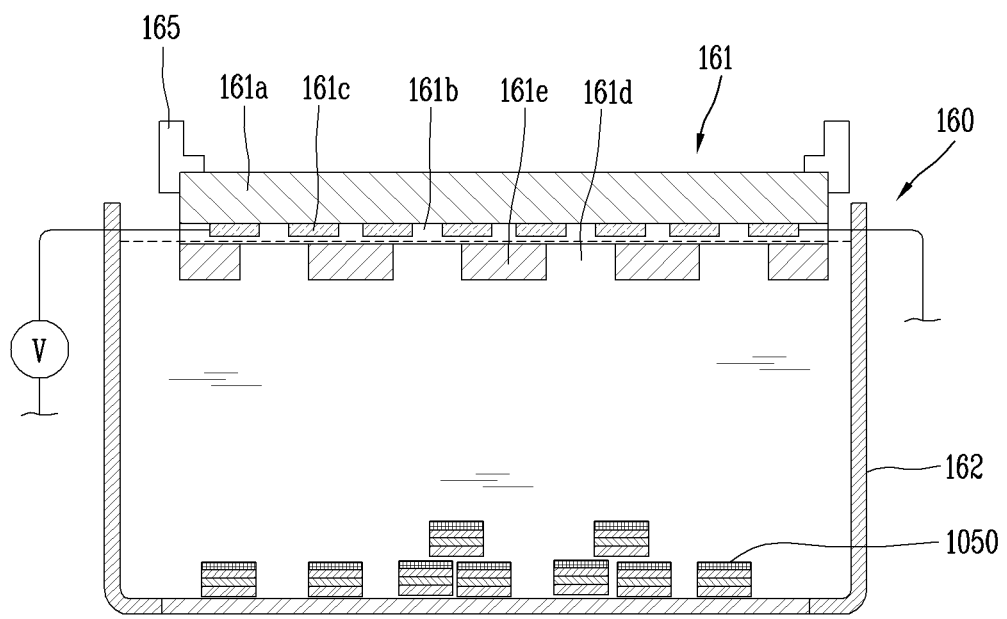
FIGS. 8a to 8e are conceptual views illustrating a process of self-assembling the semiconductor light emitting device using the self-assembly device of FIG. 6.
Figure 9:
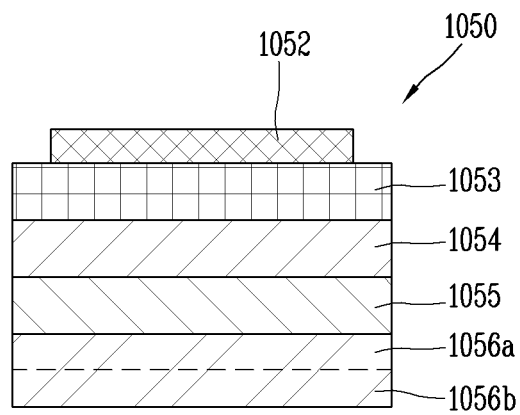
FIG. 9 is a conceptual view for explaining the semiconductor light emitting device of FIGS. 8a to 8e.

Next, the substrate 161 is transferred to the assembly position, and the semiconductor light emitting devices 1050 are loaded into the fluid chamber 162 (FIG. 8a).

As described above, the assembly position of the substrate 161 will be a position at which the fluid chamber 162 is disposed so that the assembly surface of the substrate 161, on which the semiconductor light emitting devices 1050 are assembled, faces downward.

In this case, some of the semiconductor light emitting devices 1050 may sink to the bottom of the fluid chamber 162, and some of the semiconductor light emitting devices 1050 may float in the fluid. When the light-transmitting bottom plate 166 is provided in the fluid chamber 162, some of the semiconductor light emitting devices 1050 may sink to the bottom plate 166.

Figure 8B:
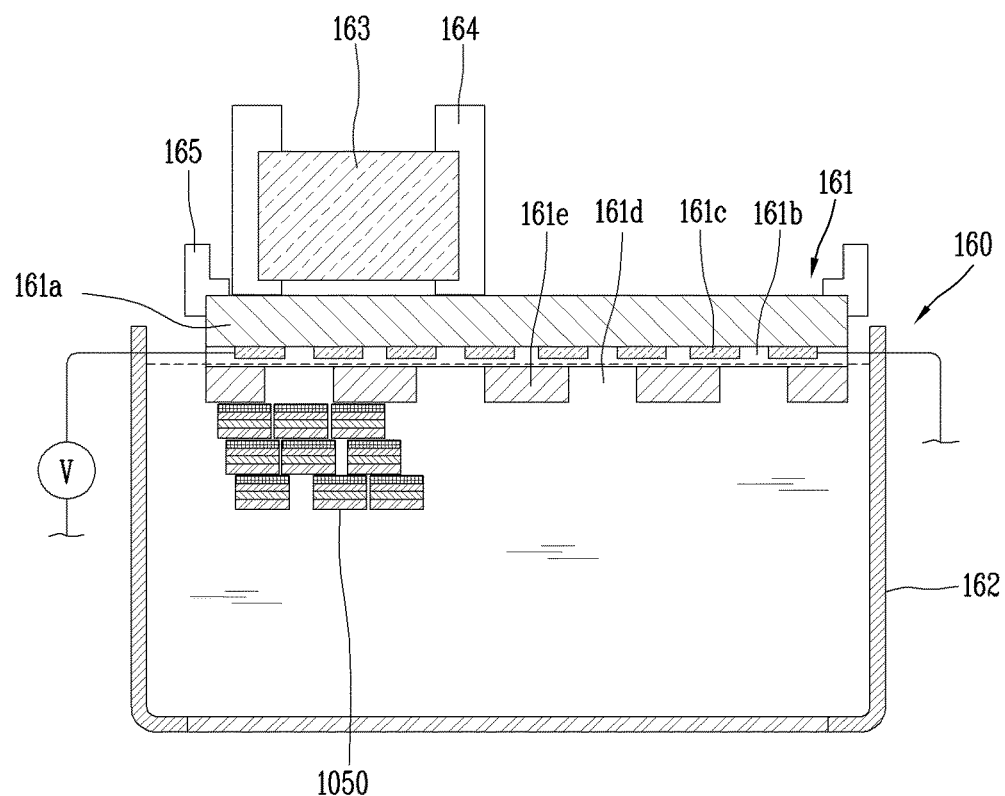

Next, the magnetic force is applied to the semiconductor light emitting devices 1050 to vertically float in the fluid chamber 162 (FIG. 8b).

When the magnet 163 of the self-assembly device moves from its original position to the opposite surface of the assembly surface of the substrate 161, the semiconductor light emitting devices 1050 float toward the substrate 161 in the fluid. The original position may be a position that is deviated from the fluid chamber 162. As another example, the magnet 163 may be provided as an electromagnet, and in this case, electricity is supplied to the electromagnet to generate initial magnetic force.

In this example, when the magnetic force is adjusted in magnitude, a spaced distance between the assembly surface of the substrate 161 and the semiconductor light emitting devices 1050 may be controlled. For example, the spaced distance may be controlled using a weight, buoyancy, and magnetic force of the semiconductor light emitting devices 1050. The spaced distance may be several mm to several tens of μm from the outermost surface of the substrate.

Figure 8C:
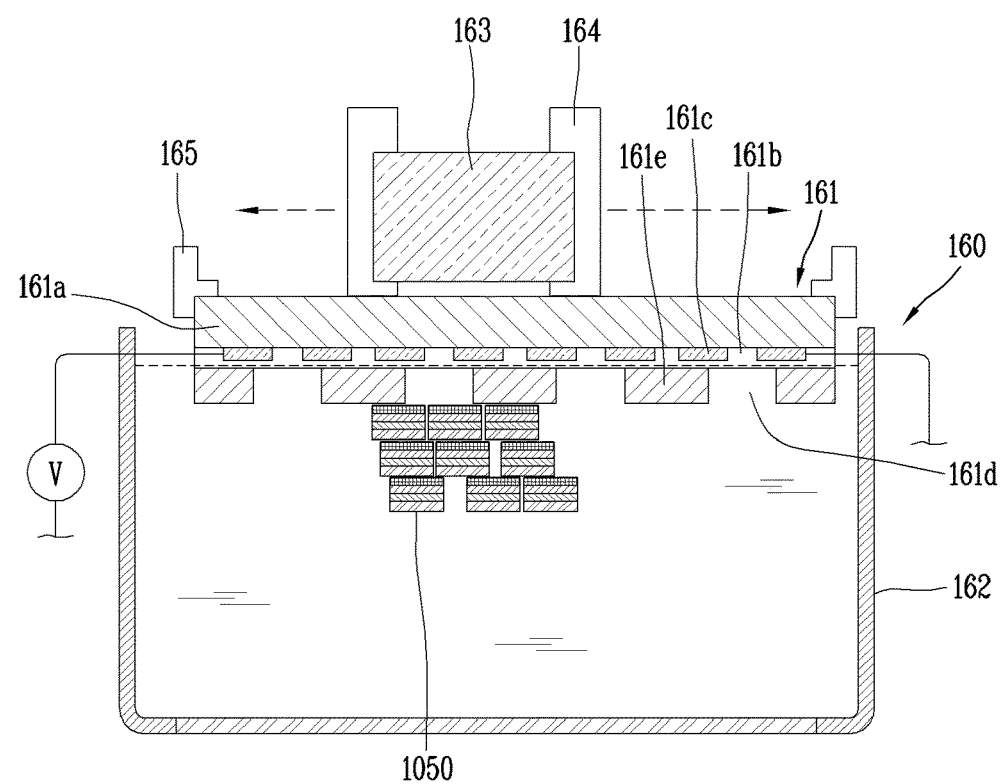

Next, the magnetic force is applied to the semiconductor light emitting devices 1050 so that the semiconductor light emitting devices 1050 move in one direction in the fluid chamber 162. For example, the magnet 163 moves in a horizontal direction, a clockwise direction, or a counterclockwise direction with respect to the substrate 161 (FIG. 8c). In this case, the semiconductor light emitting devices 1050 move in a direction parallel to the substrate 161 at a position spaced apart from the substrate 161 by the magnetic force.

Next, a process of inducing the semiconductor light emitting devices 1050 to the preset position by applying the electric field so as to be seated at a predetermined position of the substrate 161 while the semiconductor light emitting devices 1050 move is performed (FIG. 8c).

For example, the semiconductor light emitting devices 1050 move in the direction perpendicular to the substrate 161 by the electric field while the semiconductor light emitting devices 1050 move in the direction parallel to the substrate 161 and thus is seated on the preset position of the substrate 161.

More specifically, the electric field is generated by supplying power to a bi-planar electrode of the substrate 161, and the assembly is induced only at the preset position by using the electric field. That is, the semiconductor light emitting devices 1050 are self-assembled at the assembly position of the substrate 161 using the selectively generated electric field. For this, cells in which the semiconductor light emitting devices 1050 are inserted may be provided on the substrate 161.

Thereafter, a process of unloading the substrate 161 is performed, and the assembly process is completed. When the substrate 161 is the assembly substrate, as described above, a post-process for realizing the display device in which the arrayed semiconductor light emitting devices are transferred to the wiring substrate may be performed.

Figure 8D:
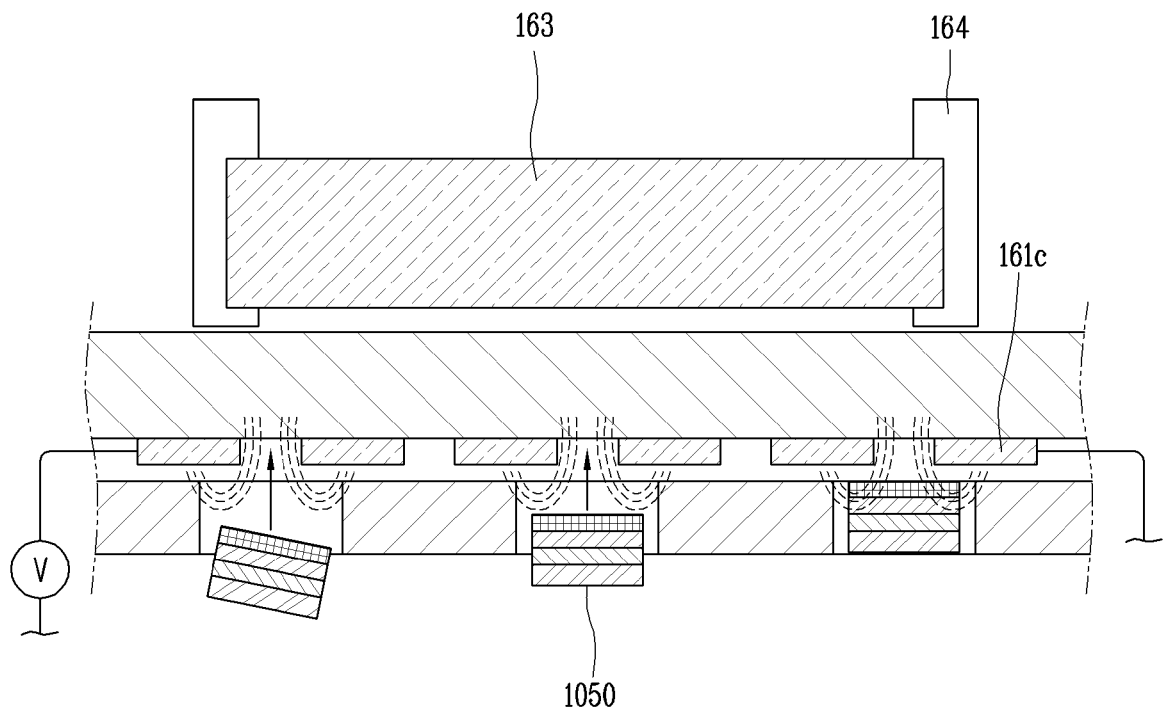
Figure 8E:
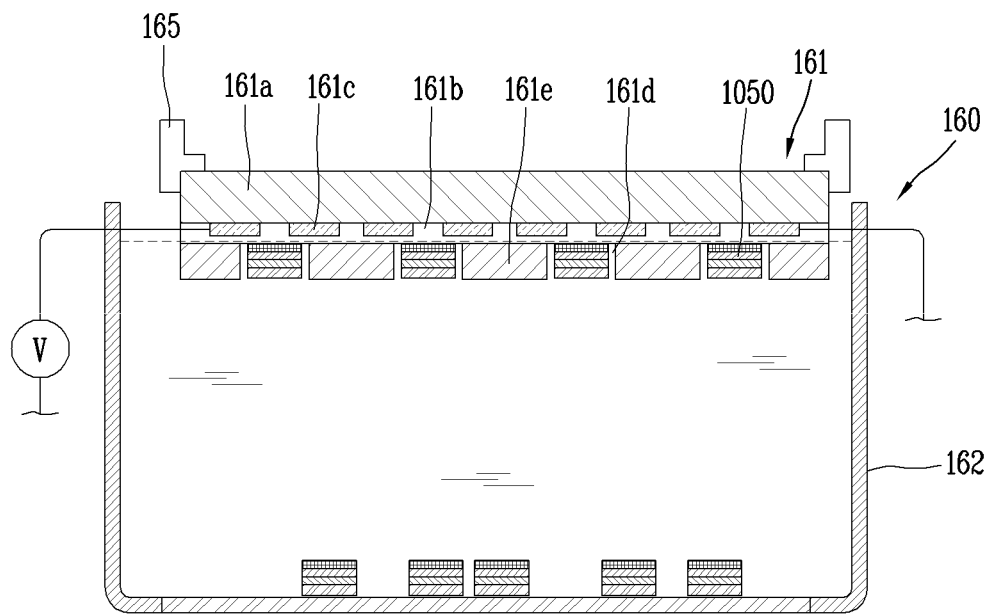

After guiding the semiconductor light emitting devices 1050 to the preset position, the magnet may move in a direction away from the substrate 161 so that the semiconductor light emitting devices 1050 remaining in the fluid chamber 162 fall to the bottom of the fluid chamber 162 (FIG. 8d). As another example, when the magnet 163 is the electromagnet, the semiconductor light emitting devices 1050 remaining in the fluid chamber 162 may fall to the bottom of the fluid chamber 162 when the supply of the power is stopped.

Thereafter, when the semiconductor light emitting devices 1050 on the bottom of the fluid chamber 162 are collected, the collected semiconductor light emitting devices 1050 may be reused.

The self-assembly device and method described above may use the magnetic field to concentrate distant components into a position near a predetermined assembly site, thereby improving assembly yield in fluidic assembly, and the electric field may be separately applied to the assembly site so that the component is assembled at only the assembly site. Here, the assembly substrate is disposed at an upper portion of the water tank, and the assembly surface is directed downward to minimize an effect of gravity due to a weight of the component and prevent non-specific coupling from occurring so as to eliminate defects. That is, in order to improve the transfer yield, the assembly substrate is disposed at the upper portion to minimize the effect of gravity or frictional force and prevent non-specific coupling from occurring.

As described above, according to the present disclosure having the above configuration, a large number of semiconductor light emitting devices may be assembled at once in the display device in which individual pixels are provided as the semiconductor light emitting devices.

As described above, according to the present disclosure, a large amount of semiconductor light emitting devices may be pixelated and then be transferred to the large-area substrate. As a result, the large-area display device may be manufactured at a low cost.

The present disclosure provides a structure and method of the assembly substrate for improving the yield of the above-described self-assembly process and the process yield after the self-assembly. The present disclosure is limited to the case in which the substrate 161 is used as an assembly substrate. That is, the assembly substrate, which will be described later, is not used as the wiring substrate of the display device. Thus, hereinafter, the substrate 161 will be referred to as the assembly substrate 161.

The present disclosure improves the process yield in two viewpoints. First, according to the present disclosure, the electric field is strongly generated at an undesired position, and thus, the semiconductor light emitting device is prevented from being seated at an undesired position. Second, the present disclosure prevents the semiconductor light emitting devices from remaining on the assembly substrate when the semiconductor light emitting devices seated on the assembly substrate are transferred to another substrate.

The above-described solutions are not individually achieved by different components. The two solutions described above may be achieved by organically coupling the components to be described later to the assembly substrate 161 described above.

Before describing the present disclosure in detail, a post-process for manufacturing the display device after the self-assembly will be described.

Figure 10A:
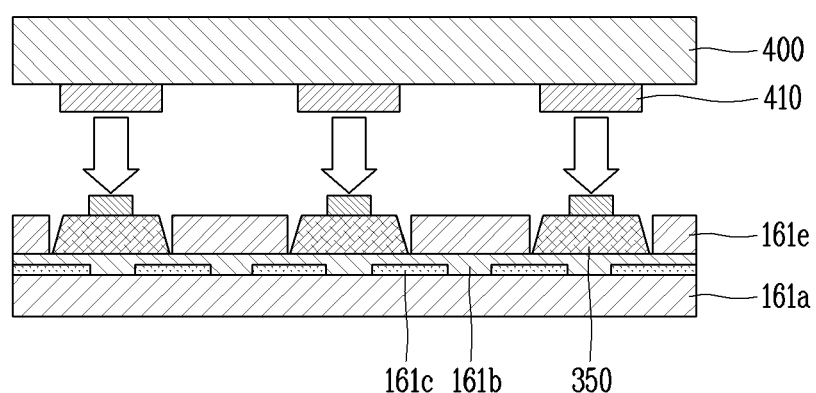
FIGS. 10a to 10c are conceptual views illustrating a process of transferring the semiconductor light emitting device after a self-assembly process according to the present disclosure.
Figure 10B:
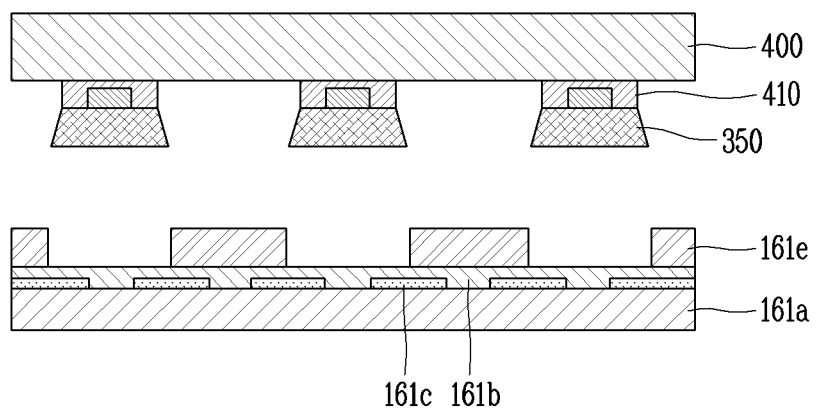
Figure 10C:
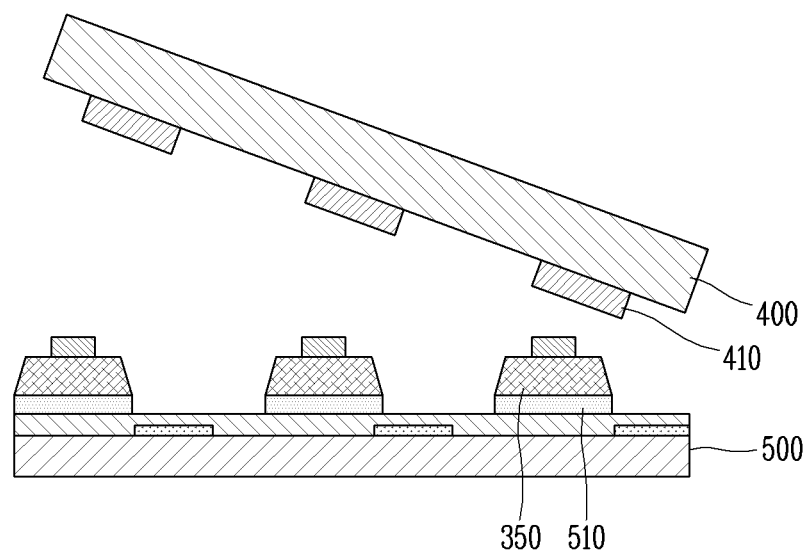

FIGS. 10a to 10c are conceptual views illustrating a process of transferring the semiconductor light emitting device after a self-assembly process according to the present disclosure.

When the self-assembly process described with reference to FIGS. 8A to 8E is completed, the semiconductor light emitting devices are seated at a preset position of the assembly substrate 161. The semiconductor light emitting devices seated on the assembly substrate 161 are transferred to another substrate at least once. In the present specification, an embodiment in which the semiconductor light emitting devices mounted on the assembly substrate 161 are transferred twice is described, but is not limited thereto. For example, the semiconductor light emitting devices mounted on the assembly substrate 161 may be transferred once or three times to another substrate.

The assembly surface of the assembly substrate 161 is in a state of facing downward (or in a direction of gravity) immediately after the self-assembly process is completed. For the self-assembly process, the assembly substrate 161 may be turned over at an angle of 180 degrees in the state in which the semiconductor light emitting device is seated. In this process, since there is a risk that the semiconductor light emitting device is separated from the assembly substrate 161, a voltage has to be applied to the plurality of electrodes 161c (hereinafter, assembly electrodes) while the assembly substrate 161 is turned over. The electric field generated between the assembly electrodes prevents the semiconductor light emitting device from being separated from the assembly substrate 161 while the assembly substrate 161 is turned over.

After the self-assembly process, if the assembly substrate 161 is turned over at the angle of 180 degrees, the assembly substrate 161 may have shape as illustrated in FIG. 10a. Specifically, as illustrated in FIG. 10a, the assembly surface of the assembly substrate 161 is in a state of facing upward (or in a direction opposite to gravity). In this state, the transfer substrate 400 is aligned above the assembly substrate 161.

The transfer substrate 400 is a substrate for separating the semiconductor light emitting devices seated on the assembly substrate 161 to transfer the semiconductor light emitting devices to the wiring substrate. The transfer substrate 400 may be made of a polydimethylsiloxane (PDMS) material. Thus, the transfer substrate 400 may be referred to as a PDMS substrate.

The transfer substrate 400 is pressed to the assembly substrate 161 after being aligned with the assembly substrate 161. Thereafter, when the transfer substrate 400 is transferred to an upper side of the assembly substrate 161, the semiconductor light emitting devices 350 disposed on the assembly substrate 161 move to the transfer substrate 400 by adhesion of the transfer substrate 400.

For this, surface energy between the semiconductor light emitting device 350 and the transfer substrate 400 has be higher than surface energy between the semiconductor light emitting device 350 and the dielectric layer 161b. As a difference between the surface energy between the semiconductor light emitting device 350 and the transfer substrate 400 and the surface energy between the semiconductor light emitting device 350 and the dielectric layer 161b increases, probability of separation of the semiconductor light emitting device 350 from the assembly substrate 161 increases, and thus, it is preferable that the difference between the two surface energy is larger.

The transfer substrate 400 may include a plurality of protrusions 410 so that a pressure applied to the transfer substrate 400 is concentrated into the semiconductor light emitting device 350 when the transfer substrate 400 is pressed to the assembly substrate 161. The protrusions 410 may be disposed at the same distance as the semiconductor light emitting devices seated on the assembly substrate 161. After aligning the protrusions 410 to overlap the semiconductor light emitting devices 350, when pressing the transfer substrate 400 to the assembly substrate 161, the pressure by the transfer substrate 400 may be concentrated into only the semiconductor light emitting device 350. Thus, the present disclosure increases the probability that the semiconductor light emitting device is separated from the assembly substrate 161.

In the state in which the semiconductor light emitting devices are seated on the assembly substrate 161, a portion of the semiconductor light emitting devices is preferably exposed to the outside of the groove. When the semiconductor light emitting devices 350 are not exposed to the outside of the groove, the pressure of the transfer substrate 400 is not concentrated into the semiconductor light emitting devices 350 so that the probability that the semiconductor light emitting device 350 is separated from the assembly substrate 161 decreases.

Finally, referring to FIG. 10c, a process of pressing the transfer substrate 400 to the wiring substrate 500 to transfer the semiconductor light emitting devices 350 from the transfer substrate 400 to the wiring substrate 500 is performed. Here, a protrusion 510 may be disposed on the wiring substrate 500. The transfer substrate 400 and the wiring substrate 500 are aligned with each other so that the semiconductor light emitting devices 350 disposed on the transfer substrate 400 and the protrusion 510 overlap each other. Thereafter, when the transfer substrate 400 and the wiring substrate 500 are pressed, the probability that the semiconductor light emitting devices 350 are separated from the transfer substrate 400 may increase due to the protrusion 510.

In order to transfer the semiconductor light emitting devices 350 disposed on the transfer substrate 400 to the wiring substrate 500, the surface energy between the semiconductor light emitting device 350 and the wiring substrate 500 has to be greater than that between the semiconductor light emitting device 350 and the transfer substrate 400. As a difference between the surface energy between the semiconductor light emitting device 350 and the wiring substrate 500 and the surface energy between the semiconductor light emitting device 350 and the transfer substrate 400 increases, probability of separation of the semiconductor light emitting device 350 from the transfer substrate 400 increases, and thus, it is preferable that the difference between the two surface energy is larger.

After transferring all the semiconductor light emitting devices 350 disposed on the transfer substrate 400 to the wiring substrate 500, a process of forming an electrical connection between the semiconductor light emitting devices 350 and the wiring electrodes formed on the wiring substrate may be performed. The structure of the wiring electrode and the method of forming the electrical connection may vary the depending on type of the semiconductor light emitting device 350.

Although not shown, an anisotropic conductive film may be disposed on the wiring substrate 500. In this case, the electrical connection may be formed between the semiconductor light emitting devices 350 and the wiring electrodes formed on the wiring substrate 500 only by pressing the transfer substrate 400 and the wiring substrate 500.

When manufacturing the display device including the semiconductor light emitting devices that emit light having different colors, the method described with reference to FIGS. 10a to 10c may be implemented in various manners. Hereinafter, a method of manufacturing the display device including the semiconductor light emitting devices that emit light having a red color R, a green color G, and a blue color B will be described.

Figure 11:
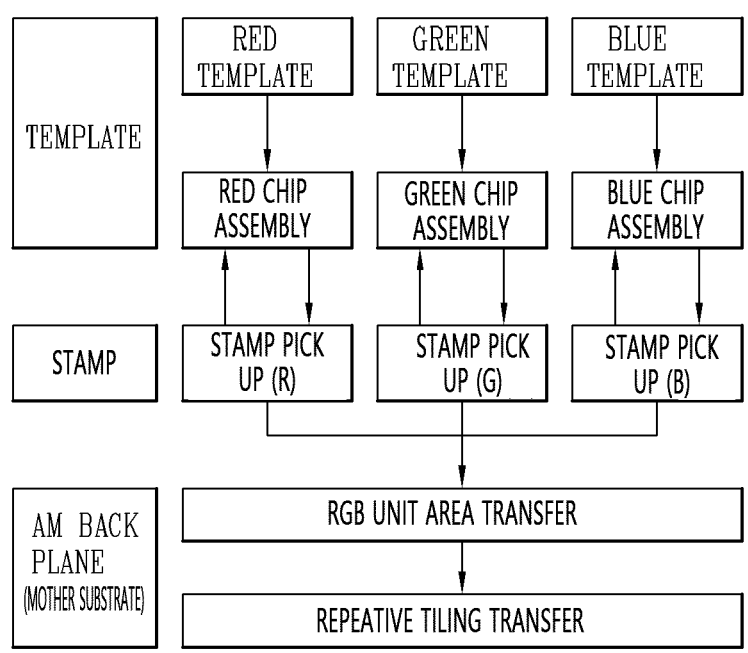
FIGS. 11 to 13 are flowcharts illustrating a method for manufacturing a display device including semiconductor lighting emitting elements that emit light having a red color R, a green color G, and a blue color B.
Figure 12:
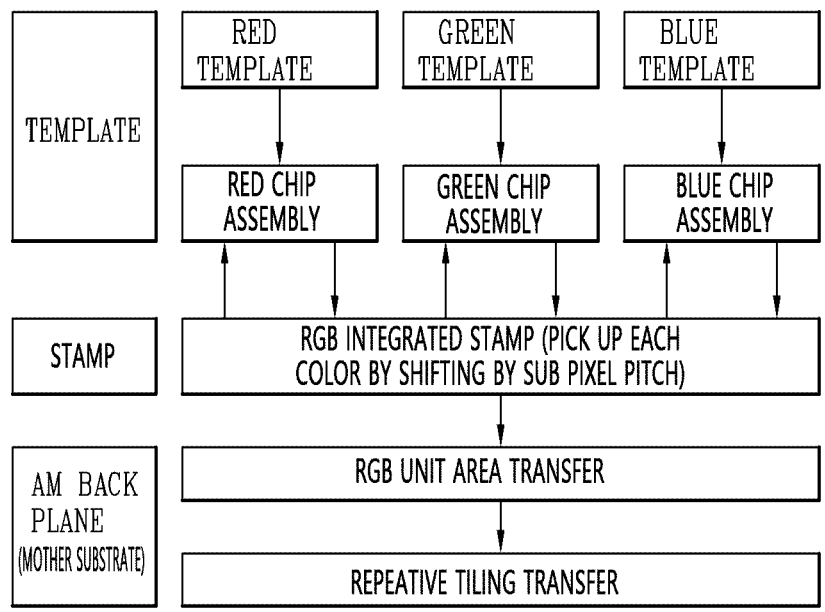
Figure 13:
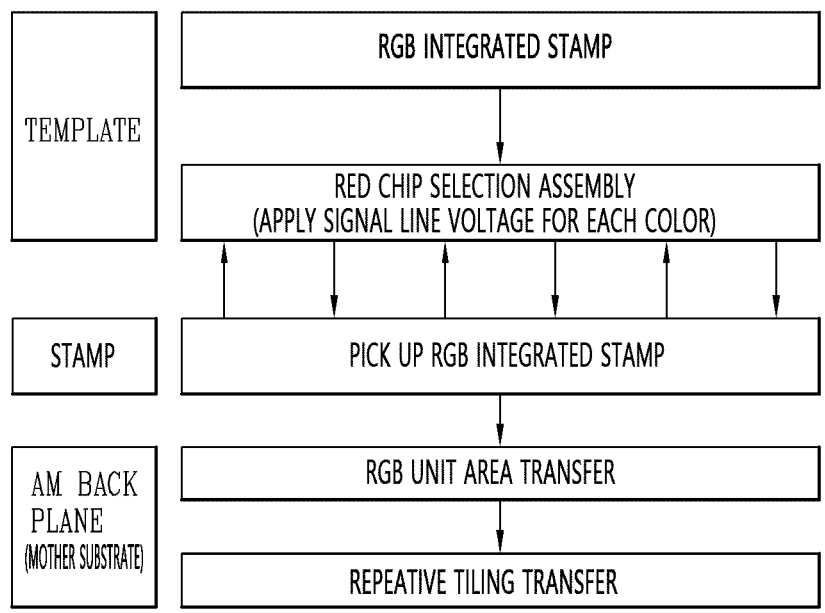

FIGS. 11 to 13 are flowcharts illustrating a method for manufacturing a display device including a semiconductor lighting emitting element that emits light having a red color R, a green color G, and a blue color B.

The semiconductor light emitting devices emitting different colors may be individually assembled on different assembly substrates. Specifically, the assembly substrate 161 may include a first assembly substrate on which semiconductor light emitting devices that emit light having a first color are mounted, a second assembly substrate on which semiconductor light emitting devices that emit light having a second color different from the first color are mounted, and a third assembly substrate on which semiconductor light emitting devices that emit light having a third color different from the first and second colors are mounted. The different types of semiconductor light emitting devices are respectively assembled on the assembly substrate according to the method described with reference to FIGS. 8a to 8e. For example, the semiconductor light emitting devices that emit light having a red color R, a green color G, and a blue color B may be assembled on the first to third assembly substrates, respectively.

Referring to FIG. 11, a red chip, a green chip, and a blue chip may be assembled on first to third assembly substrates RED TEMPLATE, GREEN TEMPLATE, AND BLUE TEMPLATE, respectively. In this state, each of the red chip, the green chip, and the blue chip may be transferred to the wiring substrate by different transfer substrates.

Specifically, the process of transferring the semiconductor light emitting devices seated on the assembly substrate to the wiring substrate may include a process of pressing the first transfer substrate (stamp R) to the first assembly substrate RED TEMPLATE to transfer the semiconductor light emitting devices (red chips) that emit the light having the first color from the first assembly substrate RED TEMPLATE to the first transfer substrate (stamp R), a process of pressing the second transfer substrate (stamp G) to the second assembly substrate GREEN TEMPLATE to transfer the semiconductor light emitting devices (green chips) that emit the light having the second color from the second assembly substrate GREEN TEMPLATE to the second transfer substrate (stamp G), and a process of pressing the third transfer substrate (stamp B) to the third assembling substrate BLUE TEMPLATE to transfer the semiconductor light emitting devices (blue chips) that emit the light having the third color from the third assembling substrate BLUE TEMPLATE to the third transfer substrate (stamp B).

Thereafter, a process of pressing each of the first to third transfer substrates to the wiring substrate to transfer the semiconductor light emitting devices that emit the light having the first to third colors from each of the first to third transfer substrates to the wiring substrate is performed.

According to the manufacturing method of FIG. 11, three types of assembly substrates and three types of transfer substrates are required to manufacture the display device including the red chip, the green chip, and the blue chip.

On the other hand, referring to FIG. 12, the red chip, the green chip, and the blue chip may be assembled on the first to third assembly substrates RED TEMPLATE, GREEN TEMPLATE, AND BLUE TEMPLATE, respectively. In this state, each of the red chip, the green chip, and the blue chip may be transferred to the wiring substrate by the same transfer substrate.

Specifically, the process of transferring the semiconductor light emitting devices seated on the assembly substrate to the wiring substrate may include a process of pressing the transfer substrate (RGB integrated stamp) to the first assembly substrate RED TEMPLATE to transfer the semiconductor light emitting devices (red chips) that emit the light having the first color from the first assembly substrate RED TEMPLATE to the transfer substrate (RGB integrated stamp), a process H pressing the transfer substrate (RGB integrated stamp) to the second assembly substrate GREEN TEMPLATE to transfer the semiconductor light emitting devices (green chips) that emit the light having the second color from the second assembly substrate GREEN TEMPLATE to the transfer substrate (RGB integrated stamp), and a process of pressing transfer substrate (RGB integrated stamp) to the third assembling substrate BLUE TEMPLATE to transfer the semiconductor light emitting devices (blue chips) that emit the light having the third color from the third assembling substrate BLUE TEMPLATE to the transfer substrate (RGB integrated stamp).

In this case, alignment positions between the first to third assembly substrates and the transfer substrate may be different from each other. For example, when an alignment between the assembly substrate and the transfer substrate is completed, a relative position of the transfer substrate with respect to the first assembly substrate and a relative position of the transfer substrate with respect to the second assembly substrate may be different from each other. The transfer substrate may shift the alignment position by a pitch of a sub-pixel whenever the type of the assembly substrate is changed. In this manner, when the transfer substrate is sequentially pressed to the first to third assembly substrates, all the three types of chips may be transferred to the transfer substrate.

Thereafter, as in FIG. 11, a process of pressing the transfer substrate to the wiring substrate to transfer the semiconductor light emitting devices that emit the light having the first to third colors from the transfer substrate to the wiring substrate is performed.

According to the manufacturing method of FIG. 12, three types of assembly substrates and one type of transfer substrates are required to manufacture the display device including the red chip, the green chip, and the blue chip.

Unlike the above-described FIGS. 11 and 12, according to FIG. 13, each of the red chip, the green chip, and the blue chip may be assembled on one assembly substrate (RGB integrated template). In this state, each of the red chip, the green chip, and the blue chip may be transferred to the wiring substrate by the same transfer substrate (RGB integrated stamp).

According to the manufacturing method of FIG. 13, one type of assembly substrates and one type of transfer substrates are required to manufacture the display device including the red chip, the green chip, and the blue chip.

As described above, when manufacturing the display device including semiconductor light emitting devices that emit light having the different colors, the manufacturing method may be implemented in various manners.

Figure 14:
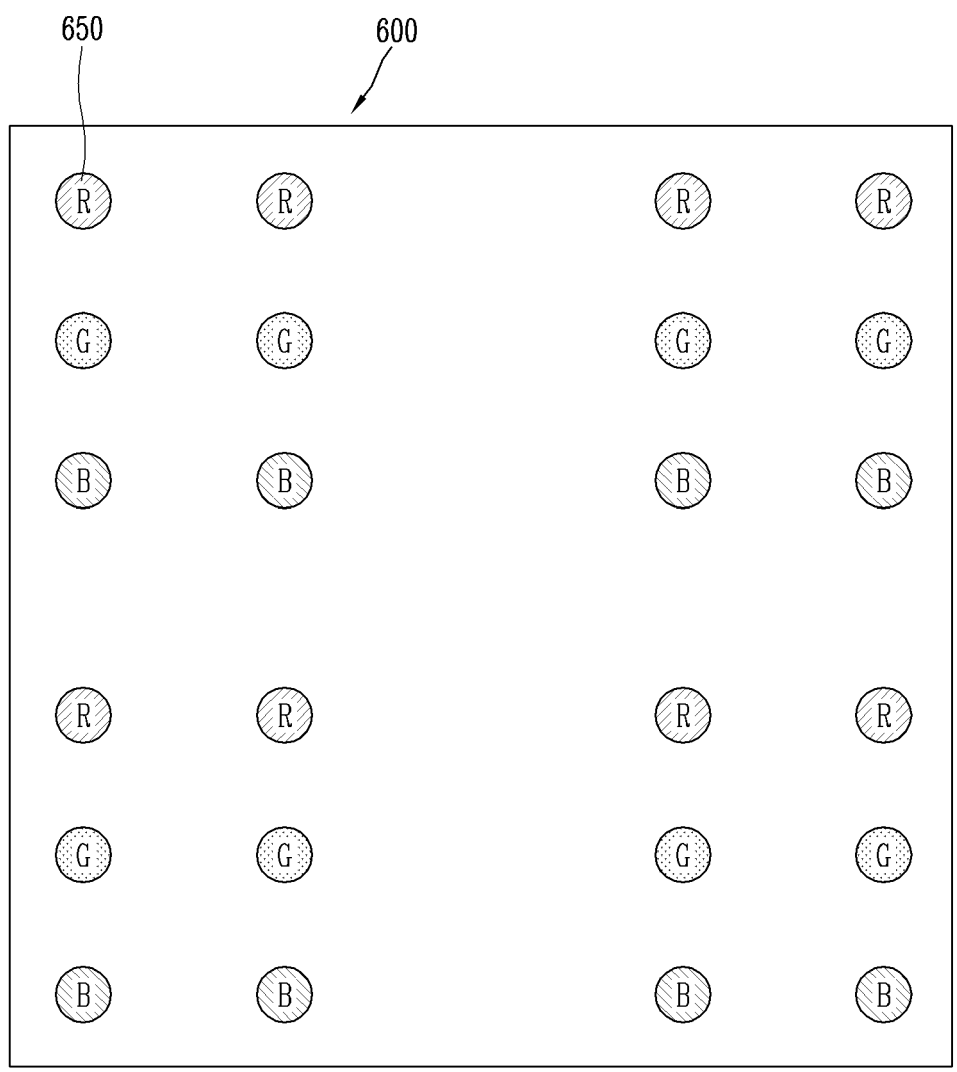
FIG. 14 is a conceptual view illustrating an arrangement of sub-pixels in the display device.
Figure 15A:
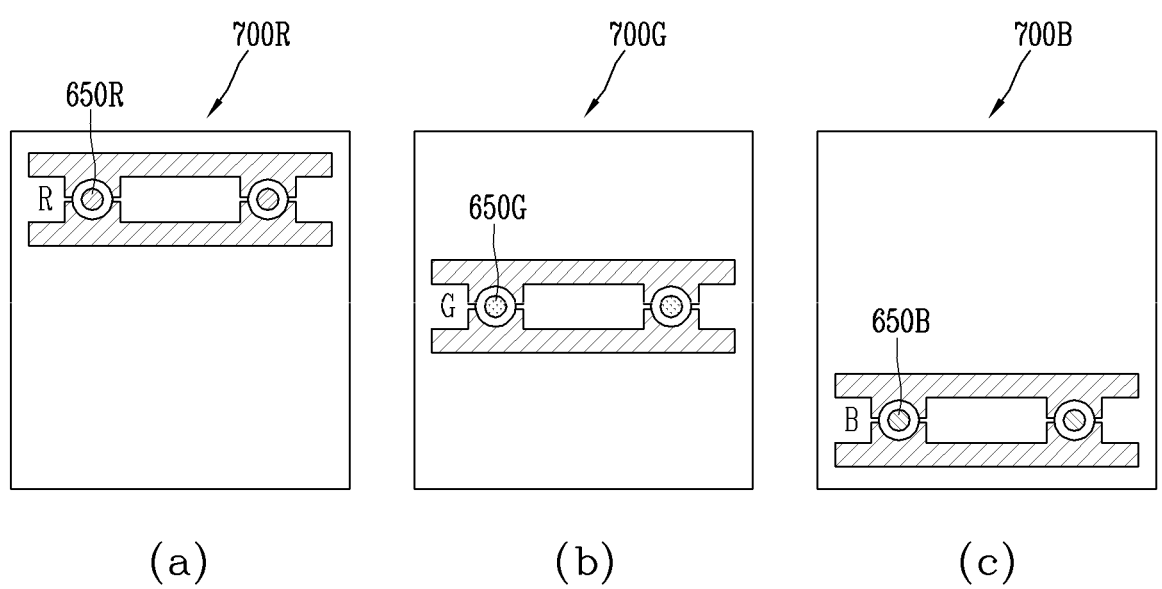
FIGS. 15a and 15b are conceptual views illustrating a transfer process of manufacturing the display device of FIG. 14.
Figure 15B:
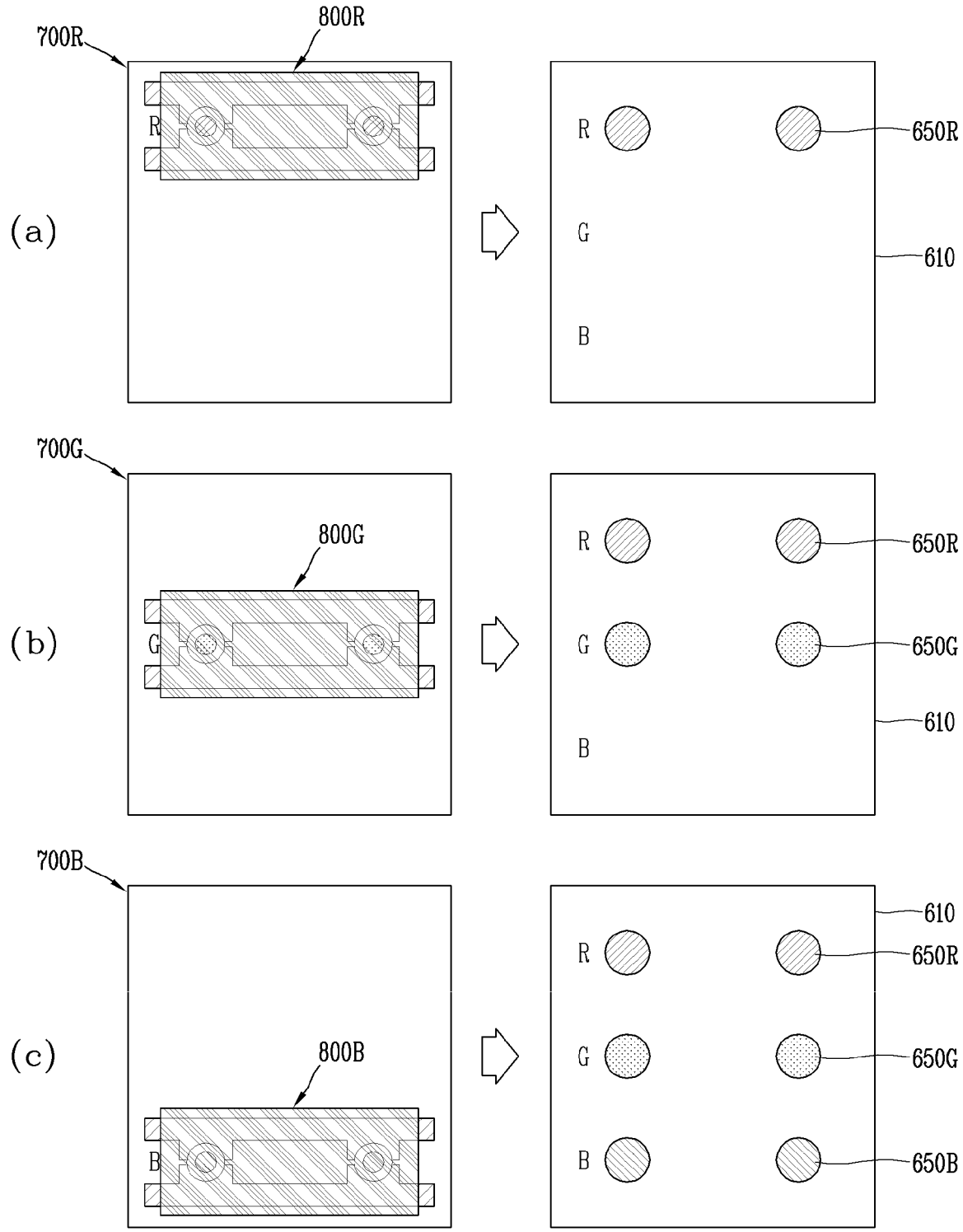

FIG. 14 is a conceptual view illustrating an arrangement of sub-pixels in the display device, and FIGS. 15a and 15b are conceptual views illustrating a transfer process of manufacturing the display device of FIG. 14.

A display device 600 includes semiconductor light emitting devices 650 arranged in a plurality of rows and columns as illustrated in FIG. 14. Each of the semiconductor light emitting devices 650 corresponds to an individual pixel, and the plurality of individual pixels forms one unit pixel. Each of the individual pixels constituting the unit pixel implements any one of red, green, and blue colors.

As the method of implementing the red, green, and blue colors, there are a method (first method) for disposing a green phosphor layer and a red phosphor layer along some lines after assembling the semiconductor light emitting devices that emit blue light, and a method (second method) for assembling the semiconductor light emitting devices that emit the light having the red, green, and blue colors. FIG. 14 illustrates a display device implemented by the method (the second method).

According to an embodiment of the method for manufacturing the display device, two transfer processes illustrated in FIGS. 15a and 15b are performed to manufacture the display device 600 illustrated in FIG. 14. FIG. 15a illustrates a primary transfer process by self-assembly, and FIG. 15b illustrates a secondary transfer process using a stamp.

Referring to the drawings, the transfer process is performed for each of red, green, and blue semiconductor light emitting devices. In FIG. 15a, a red semiconductor light emitting device 650R is assembled on a red semiconductor light emitting device assembly substrate 700R, a green semiconductor light emitting device 650G is assembled on a green semiconductor light emitting device assembly substrate 700G, and a blue semiconductor light emitting device 650B is assembled on a blue semiconductor light emitting device assembly substrate 700B. Therefore, the process of transferring the red, green, and blue semiconductor light emitting devices to the assembly substrate through the self-assembly is performed at least three times.

Since the red, green, and blue semiconductor light emitting devices are assembled with the individual assembly substrates, the secondary transfer process using the stamp is also performed at least three times. As illustrated in FIG. 15b, the red semiconductor light emitting devices 650R, the green semiconductor light emitting devices 650G, and the blue semiconductor light emitting devices 650B are sequentially transferred to a substrate 610 constituting a display device 600 by a red semiconductor light emitting device stamp 800R, a green semiconductor light emitting device stamp 800G, and a blue semiconductor light emitting device stamp 800B, each of which is made of a PDMS material.

As the display device has a large area, the number of semiconductor light emitting device transfer processes illustrated in FIG. 15 increases, and thus, a time and cost required for manufacturing the display device increase. On the other hand, when a large-area display device is implemented by the method (the first method), the number of transfer processes is reduced, but in order to maintain resolution above a certain level, an assembly electrode pattern has to be formed on the assembly substrate at intervals within a few μm. However, when the conventional assembly electrode pattern is formed at a narrower interval, short circuit may occur between the adjacent assembly electrodes when a voltage is applied.

The present disclosure relates to a substrate for manufacturing a display device, which is capable of realizing a high-resolution large-area display device through a relatively simple process. Hereinafter, a substrate for manufacturing a display device according to the present disclosure will be described with reference to the accompanying drawings.

In the present specification, the substrate for manufacturing the display device may be a substrate used for manufacturing the display device and also may be an assembly substrate on which semiconductor light emitting devices are primarily assembled through self-assembly as illustrated in FIGS. 15a and 15b. However, the present disclosure is not limited thereto, and when the semiconductor light emitting devices are directly assembled on the substrate constituting the display device, the substrate constituting the display device may be the substrate for manufacturing the display device according to the present disclosure.

Figure 16:
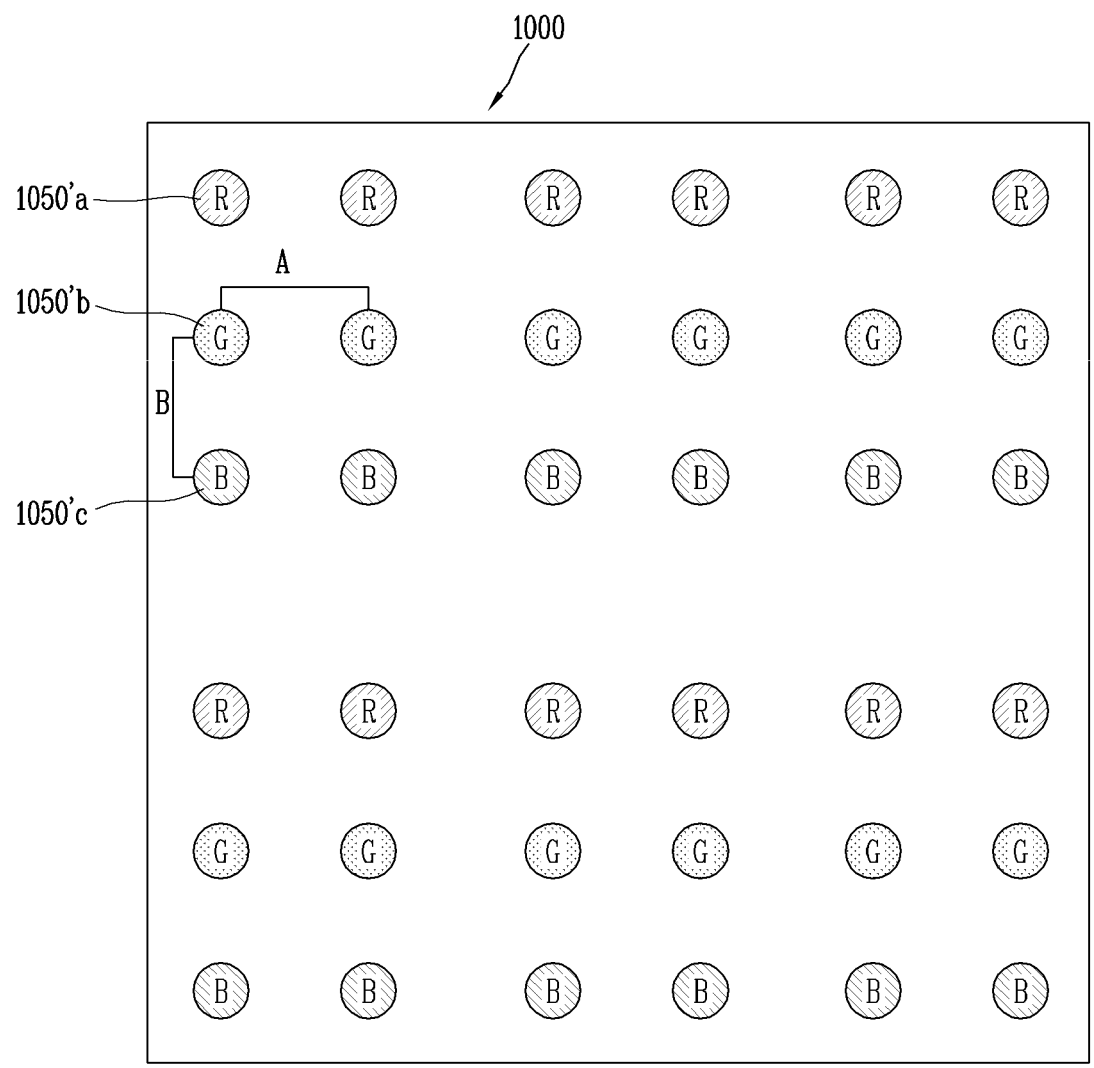
FIG. 16 is a conceptual view illustrating an arrangement of sub-pixels in the display device according to the present disclosure.
Figure 17A:
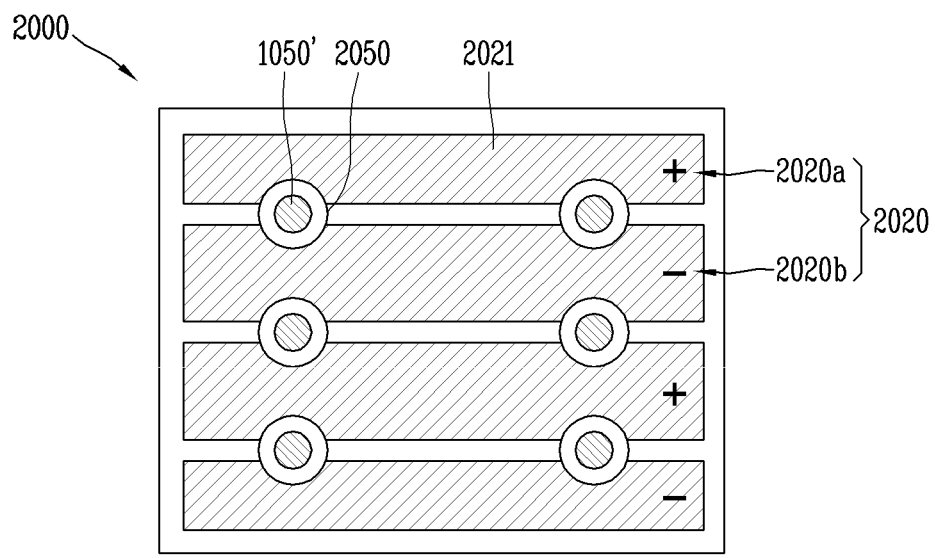
FIGS. 17a, 17b, and 18 are conceptual views illustrating an electrode assembly structure of the present disclosure for manufacturing the display device of FIG. 16.
Figure 17A:
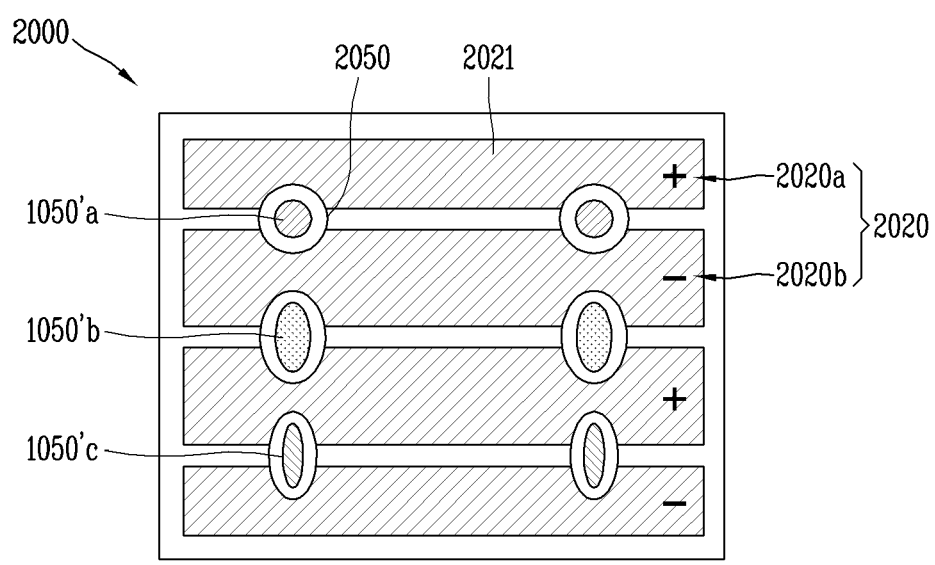
Figure 17B:
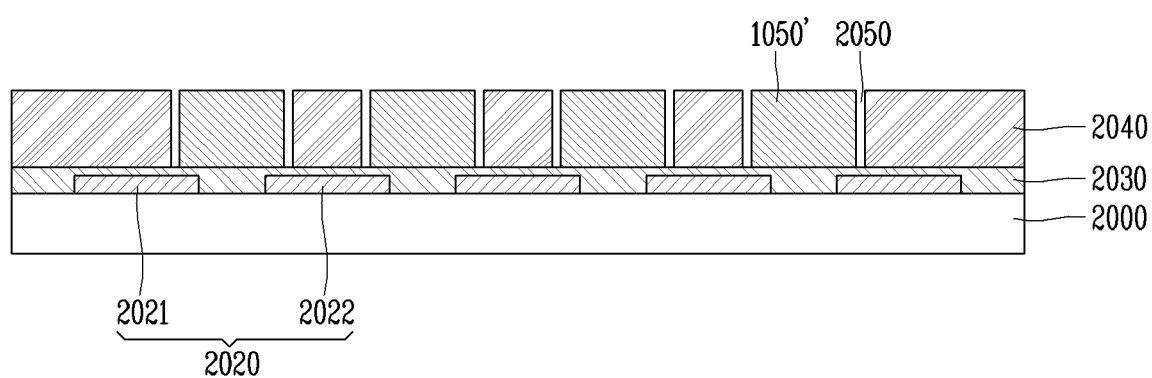
Figure 18:
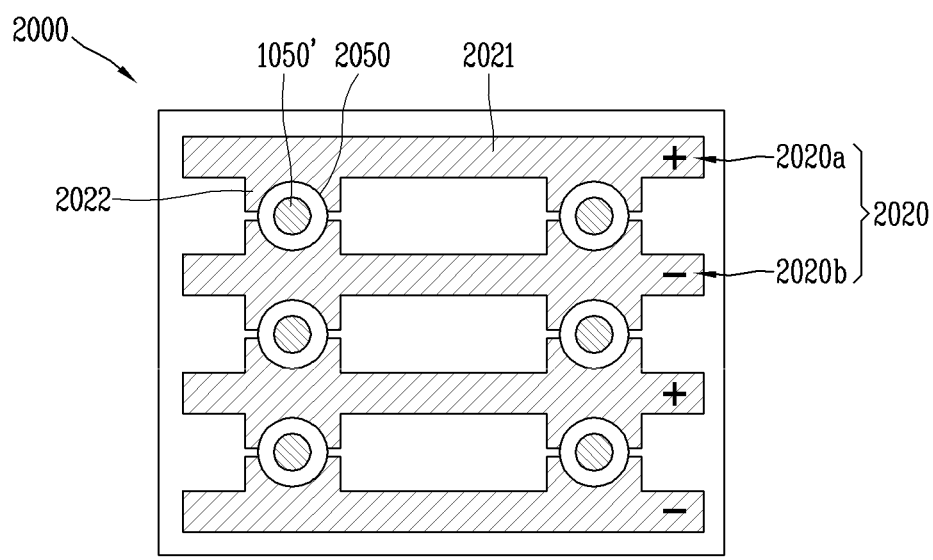
Figure 18:
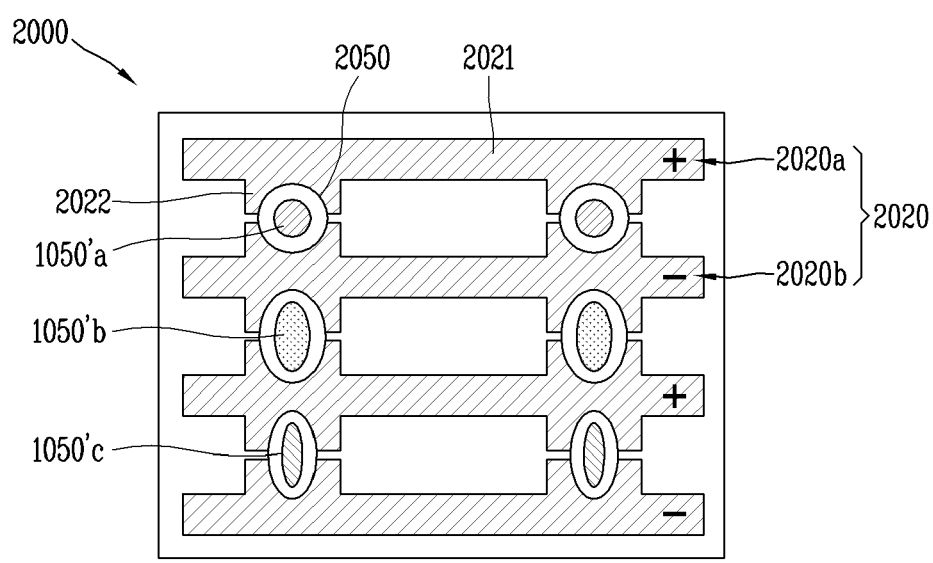

FIG. 16 is a conceptual view illustrating an arrangement of sub-pixels in the display device according to the present disclosure, and FIGS. 17a, 17b, and 18 are conceptual views illustrating an electrode assembly structure of the present disclosure for manufacturing the display device of FIG. 16.

Referring to FIG. 16, a display device 1000 according to the present disclosure includes semiconductor light emitting devices 1050' arranged in a plurality of rows and columns. Each of the semiconductor light emitting devices 1050' corresponds to an individual pixel, and the plurality of individual pixels forms one unit pixel. Each of the individual pixels constituting the unit pixel implements any one of red, green, and blue colors.

As the method of implementing the red, green, and blue colors, there are a method (first method) for disposing a green phosphor layer and a red phosphor layer along some lines after assembling the semiconductor light emitting devices that emit blue light, and a method (second method) for assembling the semiconductor light emitting devices that emit the light having the red, green, and blue colors. FIG. 16 illustrates a display device implemented by the method (the second method).

The display device 1000 according to the present disclosure may be configured by arranging semiconductor light emitting devices 1050' at an interval less than that of the conventional display device 600. In the display device 1000, the semiconductor light emitting devices 1050' have a row interval A and a column interval B, and a high resolution display device may be realized by setting the intervals to be narrow.

The present disclosure provides a structure capable of being involved in the assembly of the semiconductor light emitting devices in which one assembly electrode is disposed on two lines on the substrate for manufacturing the display device to implement the display device 1000 as illustrated in FIG. 16.

FIG. 17b is a cross-sectional view illustrating a substrate 2000 for a display device according to the present disclosure.

As illustrated in FIG. 17b, the substrate 2000 for manufacturing the display device according to the present disclosure includes a base part 2010, assembly electrodes 2020, a dielectric layer 2030, a partitioning part 2040, and a cell 2050.

The base part 2010 may be a flexible and insulating flexible substrate, and for this purpose, the base part 2010 may include a material such as polyimide (PI), polyethylene naphthalate (PEN), polyethylene terephthalate (PET), or the like.

The assembly electrodes 2020 extending in one direction may be disposed on the base part 2010. The assembly electrodes 2020 are configured to generate an electric field during self-assembly, and a detailed description of the assembly electrodes 2020 will be described later.

Also, the dielectric layer 2030 may be disposed on the base part 2010 to cover the assembly electrodes 2020. The dielectric layer 2030 may be made of an inorganic insulating material such as $SiO_2$, $SiN_x$, SiON, $Al_2O_3$, $TiO_2$, $HfO_2$, or the like.

The partitioning part 2040 made of an inorganic or organic insulating material may be disposed on the dielectric layer 2030. The partitioning part 2040 may be disposed on the dielectric layer 2030 while forming the cell 2050 in which the semiconductor light emitting device 1050' is mounted. The cells 2050 may be arranged in multiple rows and columns. In this case, the cells 2050 arranged along the row have the same row interval A as that of the semiconductor light emitting devices 1050', and the cells 2050 arranged along the column have the same column interval B as that of the semiconductor light emitting devices 1050'.

Hereinafter, the structure of the assembly electrodes 2020 proposed by the present disclosure will be described in more detail with reference to FIGS. 17 and 18.

The assembly electrodes 2020 may extend in either a row direction or a column direction to overlap the cells 2050 in the extension direction. According to the present disclosure, the assembly electrodes 2020 may include a first assembly electrode 2020a overlapping the cells 2050 arranged in one row or column as illustrated in FIGS. 17 and 18 and a second assembly electrode 2020b simultaneously overlapping cells 2050 arranged in different rows or columns adjacent to each other. That is, the conventional assembly electrode is only involved in the assembly of semiconductor light emitting devices that are seated in the cells arranged along a specific line, but according to the present disclosure, some assembly electrodes are involved in the assembly of semiconductor light emitting devices that are seated in the cells arranged along two adjacent lines. Therefore, a larger number of semiconductor light emitting devices 1050' may be assembled without additionally forming the assembly electrodes 2020, and an interval between the semiconductor light emitting devices 1050' may be narrowed.

In the present disclosure, the second assembly electrodes 2020b may be disposed between the first assembly electrodes 2020a. For example, the first assembly electrodes 2020a may be disposed at both ends of the substrate 2000 for manufacturing the display device, and the second assembly electrodes 2020b may be disposed between the first assembly electrodes 2020a.

The assembly electrodes 2020 may be provided in the form of a line extending in one direction as illustrated in FIG. 17 (a form constituted only by a body 2021 to be described later) or may include a portion that protrudes toward the cell 2050 as illustrated in FIG. 18. In the latter case, the assembly electrodes 2020 may include a body 2021 extending in a row direction or a column direction and a protrusion protruding toward the cell 2050 so as to overlap the cell 2050 on the body 2021. In this case, the first assembling electrode 2020a may include a protrusion 2022 only at one side of the body 2021, and the second assembly electrode 2020b may include a protrusion 2022 at each of both sides of the body 2021.

As described above, the semiconductor light emitting devices 1050' are arranged to have a predetermined row interval A and a column interval B, and thus, the cells 2050 in which the semiconductor light emitting devices 1050' are seated are arranged to have a predetermined row internal A (hereinafter, referred to as a first interval) and a column interval B (hereinafter, referred to as a second interval). That is, among the cells 2050, the cells arranged in the same row have the first interval A, and the cells arranged in the same column have the second interval B. The assembly electrodes 2020 may extend in a direction crossing the direction of the narrower interval among the first interval A and the second interval B.

The substrate 2000 for manufacturing the display device according to the present disclosure may manufacture the display device 1000 including the semiconductor light emitting devices 1050' that emit light having different colors. The display device 1000 may include at least two types of semiconductor light emitting devices among a first semiconductor light emitting device 1050'a that emits light having a first color, a second semiconductor light emitting device 1050'b that emits light having a second color, and a third semiconductor light emitting device 1050'c that emits light having a third color. Among the semiconductor light emitting devices 1050'a, 1050'b, and 1050'c, the same type of semiconductor light emitting devices may be seated in the cells 2050 arranged in the same row or column of the substrate 2000 for manufacturing the display device. Hereinafter, the case in which the display device 1000 includes all of the first to third semiconductor light emitting devices 1050'a, 1050'b, and 1050'c will be described.

The first to third semiconductor light emitting devices 1050'a, 1050'b, and 1050'c may have different shapes, and each of the cells 2050 in which the semiconductor light emitting devices are seated may be provided in a shape corresponding to each of the semiconductor light emitting devices. Here, the shape may be interpreted as meaning including a size. The first to third semiconductor light emitting devices 1050'a, 1050'b, and 1050'c may be preferably provided in a circular or oval shape in consideration of an assembly rate, and only one type of semiconductor light emitting devices of the first to third semiconductor light emitting devices may be provided in a circular shape. When the first to third semiconductor light emitting devices 1050'a, 1050'b, and 1050'c have different shapes, the first to third semiconductor light emitting devices 1050'a may be self-assembled at the same time on the substrate 2000 for manufacturing the display device.

The first to third semiconductor light emitting devices 1050'a, 1050'b, and 1050'c are alternately arranged along the rows or columns, and thus, the second assembly electrode 2020b may overlap the cells 2050, in which the different types of semiconductor light emitting devices are seated, at the same time. That is, one side of the second assembly electrode 2020b may overlap the cells in which any one type of semiconductor light emitting devices among the first to third semiconductor light emitting devices are mounted, and the other side may overlap the cells in which another type of semiconductor light emitting devices are mounted.

The substrate 2000 for manufacturing the display device according to the present disclosure may include a second assembly electrode 2022 involved in the assembling of the semiconductor light emitting devices 1050' for two lines as described above to implement the display device 1000 in which a greater number of semiconductor light emitting devices are disposed at a narrow interval, and thus, the number of transfer processes may be reduced.

Hereinafter, a method of manufacturing the display device 1000 using the above-described substrate 2000 for manufacturing the display device will be described.

The semiconductor light emitting devices 1050' may be seated on the substrate 2000 for manufacturing the display device according to the present disclosure through the self-assembly.

First, (a) putting the semiconductor light emitting devices 1050' into a fluid chamber, in which the self-assembly is performed, and transferring the substrate 2000 including the assembled electrodes 2020 and cells 2050 arranged in a plurality of rows and columns to a preset assembly position may be performed. In detail, the substrate 2000 may be disposed at an upper portion of the fluid chamber, and a surface (hereinafter, referred to as an assembly surface) including the assembly electrodes 2020 and cells 2050 may be immersed in the fluid chamber.

Next, (b) applying magnetic force to the semiconductor light emitting devices 1050' put into the fluid chamber from one side of the substrate 2000 to move the semiconductor light emitting devices 1050' in one direction may be performed. Here, one side of the substrate 2000 means an opposite side of the assembly surface, and magnetic force may be applied to the semiconductor light emitting devices 1050' using a magnet or an electromagnet.

Next, (c) applying a voltage to the assembly electrodes 2020 to seat the moving semiconductor light emitting devices 1050' in the cell 2050 may be performed. In this process, an electric field is generated, and voltage signals having polarities may be applied to adjacent assembly electrodes 2020 to generate the electric field.

The conventional substrate for manufacturing the display device has a structure in which a pair of assembling electrodes disposed adjacent to each other to apply different voltage signals may be disposed to overlap the cells arranged along one row or column, and thus, a specific assembly electrode is involved in assembling of the semiconductor light emitting devices in a specific line. However, the substrate 2000 for manufacturing the display device according to the present disclosure includes assembly electrodes involved in assembling of the semiconductor light emitting devices in two lines. Specifically, the substrate 2000 for manufacturing the display device may include a first assembly electrode 2020a overlapping the cells 2050 arranged in one row or column and a second assembly electrode 2020b simultaneously overlapping the cells 2050 in arranged different rows or columns adjacent to each other, and the second electrode assembly 2020b may be involved in assembling of the semiconductor light emitting devices in two line as described above.

The display device 1000 including the semiconductor light emitting devices 1050' that emit light having different colors may be manufactured using the substrate 2000 for manufacturing the display device according to the present disclosure. Specifically, first to third semiconductor light emitting devices 1050'a, 1050'b, and 1050'c may be assembled to the substrate 2000 for manufacturing the display device to manufacture the display device 1000 constituted by the above-described first to third semiconductor light emitting devices 1050'a, 1050'b, and 1050'c. The first to third semiconductor light emitting devices 1050'a, 1050'b, and 1050'c may be provided in different shapes, and the cells 2050 may also be provided in a shape corresponding to each of the semiconductor light emitting devices. In this case, the processes (a) to (c) described above may be collectively performed for the first to third semiconductor light emitting devices 1050'a, 1050'b, and 1050'c.

That is, the first to third semiconductor light emitting devices 1050'a, 1050'b, and 1050'c may not be assembled on a different substrate for each color or sequentially for each color on the same substrate as in the related art, but the first to third semiconductor light emitting devices 1050'a, 1050'b, and 1050'c may be put into the fluid chamber at once, and the first to third semiconductor light emitting devices 1050'a, 1050'b, and 1050'c may be self-assembled at the same time. Thus, the number of first transfer process through the self-assembly is reduced.

According to the present disclosure, after the self-assembly, the process of transferring the semiconductor light emitting devices 1050' seated on the substrate 2000 to the wiring substrate may be performed. This means a secondary transfer process using a stamp. Since the number of primary transfer process is reduced, the number of the secondary transfer process is also reduced.

Alternatively, after the self-assembly, a process of forming the wiring electrode for lighting the semiconductor light emitting devices 1050' seated on the substrate 2000 may be performed. In this case, the finally manufactured display device 1000 includes both the assembly electrode 2020 and the wiring electrode.

As described above, the present disclosure may reduce the number of assembly electrodes 2020 to which the voltage is applied during the self-assembly, and thus, the cells 2050 on which the semiconductor light emitting devices 1050' are seated may be disposed at denser interval, and furthermore, the high-resolution display device 1000 may be implemented. In addition, the present disclosure may reduce the manufacturing cost while simplifying the process of manufacturing the display device.

The invention claimed is:

1. A substrate for manufacturing a display device, the substrate comprising:
   a base part;
   assembly electrodes extending in one direction and arranged on the base part;
   a dielectric layer disposed on the base part to cover the assembly electrodes, wherein a lower surface of the dielectric layer is disposed on an upper surface of the assembly electrodes;
   a partitioning part disposed on the dielectric layer; and
   cells provided in a plurality of rows and columns by the partitioning part and on which semiconductor light emitting devices are loaded,
   wherein the assembly electrodes extend in either the row direction or the column direction to overlap the cells in the extending direction, and
   the assembly electrodes comprise a first assembly electrode overlapping the cells arranged in one row or column, and a second assembly electrode simultaneously overlapping the cells arranged in different rows or columns adjacent to each other, and the assembly electrodes are not electrically connected to the semiconductor light emitting devices disposed in the cells.

2. The substrate according to claim 1, wherein the second assembly electrode is disposed between the first assembly electrodes.

3. The substrate according to claim 1, wherein the assembly electrodes comprise:
a body extending in the row direction or column direction; and
a protrusion protruding toward the cell to overlap the cell on the body,
wherein the first assembly electrode comprises the protrusion at one side of the body, and
the second assembly electrode comprises the protrusion at each of both sides of the body.

4. The substrate according to claim 1, wherein cells arranged in the same row among the cells have a first interval, and
cells arranged in the same column have a second interval.

5. The substrate according to claim 4, wherein the assembly electrodes extend in a direction crossing a direction of a narrower interval of the first interval and the second interval.

6. The substrate according to claim 1, wherein at least two types of semiconductor light emitting devices among a first semiconductor light emitting device that emits light having a first color, a second semiconductor light emitting device that emits light having a second color, and a third semiconductor light emitting device that emits light having a third color are seated in the cells, and
same type of semiconductor light emitting devices are seated in the cells arranged in the same row or column.

7. The substrate according to claim 6, wherein different types of semiconductor light emitting devices have different shapes, and
each of the cells in which the different types of semiconductor light emitting devices are seated has a shape corresponding to each of the semiconductor light emitting devices.

8. The substrate according to claim 6, wherein the second assembly electrode overlaps the cells in which different types of semiconductor light emitting devices are mounted.

9. The substrate according to claim 1, wherein
the first assembly electrode includes a first body extending in the one direction and a first protrusion protruding towards a first side of the cell,
the second assembly electrode includes a second body extending in the one direction and a second protrusion protruding towards a second side of the cell,
a distal end of the first protrusion includes a first concave portion as seen in plan view, and
a distal end of the second protrusion includes a second concave portion as seen in plan view.

10. The substrate according to claim 9, wherein
the distal end of the first protrusion includes a flat portion on each side of the first concave portion as seen in plan view,
the distal end of the second protrusion includes a flat portion on each side of the second concave portion as seen in plan view, and
each flat portion of the first protrusion is spaced apart from each flat portion of the second protrusion in plan view.

11. The substrate according to claim 9, wherein a semiconductor light emitting device of the semiconductor light emitting devices is partially disposed in each of the first concave portion and the second concave portion as seen in plan view.

* * * * *